United States Patent
Kim et al.

(10) Patent No.: US 10,091,917 B2
(45) Date of Patent: Oct. 2, 2018

(54) TRANSPARENT EMI SHIELDING/ABSORBING FILM

(71) Applicant: Korea Institute of Science and Technology, Seoul (KR)

(72) Inventors: Sang Woo Kim, Seoul (KR); Dong Gyun Kim, Seoul (KR)

(73) Assignee: Korea Institute of Science and Technology, Seoul (KR)

( * ) Notice: Subject to any disclaimer, the term of this patent is extended or adjusted under 35 U.S.C. 154(b) by 2 days.

(21) Appl. No.: 15/237,003

(22) Filed: Aug. 15, 2016

(65) Prior Publication Data

US 2017/0265338 A1    Sep. 14, 2017

(30) Foreign Application Priority Data

Mar. 11, 2016  (KR) .................. 10-2016-0029718

(51) Int. Cl.
*H05K 9/00*    (2006.01)

(52) U.S. Cl.
CPC .................. *H05K 9/0096* (2013.01)

(58) Field of Classification Search
CPC ........ H05K 9/00; H05K 9/009; H05K 9/0081; H05K 9/0094; H05K 9/0096; H01J 11/44; H01J 2211/446; Y10T 428/24479; Y10T 428/24521; Y10T 428/24545; Y10T 428/2457; Y10T 428/24562; B32B 3/00; B32B 3/28; B32B 3/30
See application file for complete search history.

(56) References Cited

U.S. PATENT DOCUMENTS

| | | | |
|---|---|---|---|
| 2008/0166546 A1* | 7/2008 | Jo | G02B 5/223 428/332 |
| 2010/0165469 A1* | 7/2010 | Hwang | H01J 11/10 359/614 |
| 2011/0273085 A1* | 11/2011 | Garbar | H01L 31/1884 313/509 |

FOREIGN PATENT DOCUMENTS

| | | |
|---|---|---|
| KR | 10-2007-0035832 A | 4/2007 |
| KR | 10-2008-0095977 A | 10/2008 |
| KR | 10-2015-0135981 A | 12/2015 |

OTHER PUBLICATIONS

Translation of KR20150135981; published Dec. 4, 2015.*
Korean Office Action dated Jul. 28, 2017 in corresponding Korean Patent Application No. 10-2016-0029718 (1 page in English and 8 pages in English).

* cited by examiner

*Primary Examiner* — Catherine A. Simone
(74) *Attorney, Agent, or Firm* — NSIP Law

(57) ABSTRACT

A transparent EMI shielding/absorbing film is provided. The transparent EMI shielding/absorbing film includes a transparent substrate having a top surface on which a pattern having a plurality of engraved grooves is disposed, a conductive layer disposed in the grooves, and a conductive nanowire layer disposed on the top surface of the transparent substrate and electrically connected with the conductive layer.

11 Claims, 21 Drawing Sheets

TRANSPARENT EMI SHIELDING/ABSORBING FILM

CROSS-REFERENCE TO RELATED APPLICATION

This application claims priority to and the benefit of Korean Patent Application No. 2016-0029718, filed on Mar. 11, 2016, the disclosure of which is incorporated herein by reference in its entirety.

BACKGROUND

1. Field of the Invention

The present invention relates to a transparent EMI shielding film, and more particularly, to an EMI shielding/absorbing film having further improved EMI shielding/absorbing performance and light transmission.

2. Discussion of Related Art

In recent years, electromagnetic interference (EMI) has increased rapidly with the trend towards high functionality, high capacity and high performance of various electrical or electronic devices.

The EMI is becoming known as a cause of malfunctioning in the electrical or electronic devices. Therefore, it is necessary to shield and absorb electromagnetic waves generated from the electronic devices to prevent such malfunctioning. To shield and absorb the electromagnetic waves, conductive or magnetic metals, ceramics, or conductive polymers may be used instead of materials including metals, ceramics, and polymers through which the electromagnetic waves do not penetrate. For example, there are methods including making use of a housing made of a metal, inserting a metal plate between circuit boards, or covering a cable with metal foil, etc. Meanwhile, EMI shielding films for display devices require transparency since the EMI shielding films have to allow recognizing what is displayed on a screen. However, since the EMI shielding films cannot have guaranteed transparency due to opaqueness of a conductive layer made of functional particles such as metals, EMI shielding films exhibiting light transmission has been in demand.

Such transparent EMI shielding films are classified into mesh type and conductive film type.

FIG. 1 is a cross-sectional view of a conventional mesh-type EMI shielding film.

Referring to FIG. 1, a conventional mesh-type EMI shielding film 10 has a structure in which a pattern having engraved grooves is formed on a top surface of a transparent substrate 11, and a conductive metal 12 is disposed in the grooves. Since the conductive metal 12 has a very small width, transparency of the EMI shielding film 10 may be maintained overall.

However, the mesh-type EMI shielding film 10 has a problem in that it has very low level of light transmittance when the conductive metal 12 required to exhibit a sufficient shielding property is printed with an ink or paste in the form of a polymer complex. Also, the mesh-type EMI shielding film 10 has limits in the thickness due to a printing problem of the conductive metal 12 and thus has limitations in enhancing shielding performance. Also, a method of forming a mesh plating layer of silver, copper, or the like using a plating method to enhance conductivity of the conductive metal with a small thickness may be applied to significantly improve electrical conductivity of the conductive metal and enhance EMI shielding ability, there is a problem in that the process is complicated and not environmentally friendly.

FIG. 2 is a cross-sectional view of a conventional conductive film-type EMI shielding film.

Referring to FIG. 2, a conventional conductive film-type EMI shielding film 20 has a structure in which a thin conductive film 23 is disposed on a transparent substrate. The conductive film 23 has a sufficiently small thickness not to impair overall transparency of the EMI shielding film 20. For example, the conductive film 23 may be formed of nanowires.

The conductive film-type EMI shielding film 20 has a drawback in that the thickness of the conductive film 23 may need to be increased excessively to realize a sufficient shielding property, and thus light transmission may be degraded. Also, when the thickness of the conductive film 23 is made too small for light transmission, a conductive network may be disconnected and result in a degraded shielding property. In particular, when silver nanowires which have been used as a material for conductive films are applied to display devices such as touch screens, haze may be increased and contrast may be lowered.

Therefore, there is a demand for transparent EMI shielding/absorbing films capable of exhibiting sufficient EMI shielding performance while simultaneously maintaining the light transmission.

SUMMARY OF THE INVENTION

The present invention is directed to a transparent EMI shielding/absorbing film having excellent EMI shielding/absorbing performance without impairing light transmission and visibility.

According to an aspect of the present invention, there is provided a transparent EMI shielding/absorbing film, which a transparent substrate having a top surface on which a pattern having a plurality of engraved grooves is disposed, a conductive layer disposed in each of the grooves, and a conductive nanowire layer disposed on the top surface of the transparent substrate and electrically connected with the conductive layer.

By way of an example, the conductive layer may be formed of a conductive material for shielding and absorbing electromagnetic waves.

By way of an example, the conductive layer may be formed of conductive nanowires.

By way of an example, the conductive layer may be arranged so that a first layer formed of a conductive material for shielding and absorbing electromagnetic waves and a second layer formed of conductive nanowires are disposed alternately disposed at least once.

By way of an example, the transparent EMI shielding/absorbing film may further include a black matrix in contact with a base surface of the grooves.

By way of an example, the conductive nanowire layer may be disposed on a bottom surface facing the top surface of transparent substrate.

According to another aspect of the present invention, there is provided a transparent EMI shielding/absorbing film, which includes a transparent substrate having a top surface on which a pattern having a plurality of engraved grooves is disposed, and a conductive layer disposed in the grooves. Here, the conductive layer may include a conductive nanowire groove layer formed of conductive nanowires.

By way of an example, the conductive layer may further include a conductive groove layer formed of a conductive material for shielding and absorbing electromagnetic waves.

By way of an example, the conductive layer may be arranged so that the conductive groove layer and the conductive nanowire groove layer are alternately disposed at least once.

By way of an example, the transparent EMI shielding/absorbing film may further include a black matrix in contact with base sides of the grooves.

By way of an example, the matrix may further include a conductive material for shielding and absorbing electromagnetic waves.

By way of an example, the conductive material may include at least one selected from the group consisting of a metal, a conductive ceramic, a conductive polymer and a composite thereof.

By way of an example, the metal may include at least one selected from the group consisting of silver, copper, aluminum, gold, palladium, platinum, nickel, rhodium, ruthenium, tungsten, zinc, a silver-gold alloy, a copper-nickel alloy, a silver-palladium alloy, and a silver-gold-palladium alloy.

By way of an example, the conductive ceramics may include at least one selected from the group consisting of indium tin oxide (ITO), doped zinc oxide, silicon carbide, carbon, carbon nanotubes (CNTs), and graphene.

By way of an example, the conductive polymer may include at least one selected from the group consisting of a polyacetylene, a polypyrrole, a polythiophene, a polyisothianaphthene, a polyphenylenevinylene, a polyaniline, a polyalkylthiophene, and a polyfuran.

By way of an example, the conductive layer may include at least one selected from the group consisting of a magnetic metal, a magnetic ceramic, a dielectric, a conductive plastic, and a core/shell-shaped composite.

By way of an example, the conductive layer may further include at least one selected from the group consisting of a magnetic metal having shape anisotropy, a magnetic ceramic, and a polymer composite including dielectric particles, in the groove layer. More preferably, the conductive layer may further include at least one selected from the group consisting of conductive nanowires used to improve electrical connection between particles, nanotubes, and a polymer composite including the nanowires.

BRIEF DESCRIPTION OF THE DRAWINGS

The above and other objects, features and advantages of the present invention will become more apparent to those of ordinary skill in the art by describing in detail exemplary embodiments thereof with reference to the accompanying drawings, in which.

DETAILED DESCRIPTION OF EXEMPLARY EMBODIMENTS

Exemplary embodiments of the present invention will be described in detail below with reference to the accompanying drawings.

Prior to the description, it should be understood that the terms used in the specification and appended claims should not be construed as limited to the general and dictionary meanings and should be interpreted based on the meanings and concepts corresponding to the technical aspects of the present invention on the basis of the principle that the inventor is allowed to define the terms appropriately for the best explanation. Therefore, the description proposed herein is just a preferable example for the purpose of illustration only, not intended to limit the scope of the invention, so it should be understood that other equivalents and modifications could be made without departing from the scope of the invention.

Figure 3:
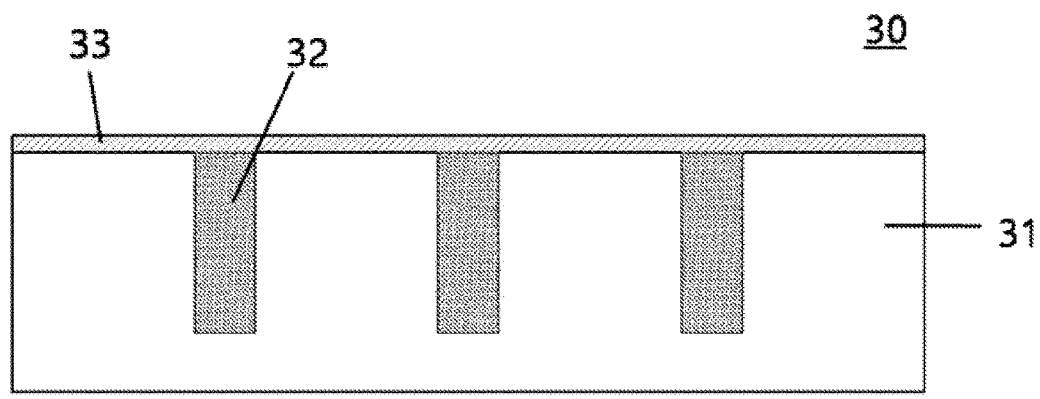
FIG. 3 is a cross-sectional view of a transparent EMI shielding/absorbing film according to one exemplary embodiment of the present invention.

FIG. 3 is a cross-sectional view of a transparent EMI shielding/absorbing film according to one exemplary embodiment of the present invention.

Referring to FIG. 3, a transparent EMI shielding/absorbing film 30 according to one exemplary embodiment of the present invention may include a transparent substrate 31 having a top surface on which a pattern having a plurality of engraved grooves is formed, a conductive layer 32 disposed in the grooves, and a conductive nanowire layer 33 disposed on the top surface of the transparent substrate 31 and electrically connected with the conductive layer 32.

The transparent substrate 31 may be a transparent polymer resin or glass having a top surface on which a pattern having a plurality of engraved grooves is formed using various methods including imprinting, etc. Also, the transparent polymer resin may include at least one selected from the group consisting of polyethylene terephthalate (PET), polycarbonate (PC), polymethyl methacylate (MMA), triacetate cellulose (TAC), and polyethersulfone (PES).

The conductive layer 32 may be formed of a conductive material such as a metal, a conductive ceramic, a conductive polymer, or a composite thereof and may be disposed in the grooves. Specifically, the conductive metal may include at least one metal element selected from the group consisting of silver, copper, aluminum, gold, palladium, platinum, nickel, rhodium, ruthenium, tungsten, and zinc. Also, the conductive metal may include a metal alloy such as silver-gold alloy, a copper-nickel alloy, a silver-palladium alloy, and a silver-gold-palladium alloy. The conductive ceramic may include at least one ceramic material selected from the group consisting of indium tin oxide (ITO), doped zinc oxide, silicon carbide, carbon, carbon nanotubes (CNTs), and graphene. More specifically, the conductive ceramic may be formed in a filling structure in which conductive particles of the metal or ceramic having a platy or acicular structure or a complex structure thereof which has an aspect ratio (i.e., length/thickness ratio) of 5/20 or 20/50 or 40/100 to improve conductivity are stacked. The conductive polymer may include at least one organic or polymeric material selected from the group consisting of a polyacetylene, a polypyrrole, a polythiophene, a polyisothianaphthene, a polyphenylenevinylene, a polyaniline, a polyalkylthiophene, and a polyfuran.

To give an absorbing function, the conductive layer 32 may further include at least one selected from the group consisting of a magnetic metal, a magnetic ceramic, a dielectric, a conductive plastic, and a core/shell-shaped composite in addition to the conductive material.

The conductive nanowire layer 33 may have an acicular or filiform shape, and may be a linear or curved shape conductive material having a nanometer-sized diameter. When the transparent conductive layer formed of the conductive nanowires is used, a conductive film exhibiting excellent bending resistance may be obtained. Also, when the transparent conductive layer formed of the conductive nanowires is used, the conductive nanowires may be combined to form a network structure. As a result, even when a small amount of the conductive nanowires are used, a good electric conduction path may be formed, and a conductive film having low electric resistance may be obtained. Also, since openings are formed in the network when the conductive nanowires are combined to form a network structure, a conductive film having high light transmittance may be obtained. Specifically, when the conductive nanowires having a high aspect ratio are used, the conductive nanowires may be intermingled, and thus a small amount of the conductive nanowires may be used to obtain a conductive film capable of expressing high conductivity and simultaneously showing high light transmittance. For example, the conductive nanowires may include metal nanowires, conductive nanowires including carbon nanotubes, etc. Preferably, the metal nanowires may be formed of at least one selected from the group consisting of gold, platinum, silver, copper, nickel, copper and, an alloys thereof.

When the conductive nanowire layer 33 is disposed on a top surface of the transparent substrate 31 having a pattern in which a plurality of grooves are engraved and the conductive nanowire layer 33 is electrically connected with the conductive layer 32 filling each of the grooves, an excessive decrease in light transmittance of the EMI shielding/absorbing film 30 may be prevented. Thus, when it is difficult to realize sufficient shielding effectiveness by using only the conductive layer 32, the shielding effectiveness may also be improved.

The transparent EMI shielding/absorbing film 30 according to one exemplary embodiment of the present invention may have a light transmittance of 60% or more, preferably 85% or more. Also, the transparent EMI shielding/absorbing film 30 according to one exemplary embodiment of the present invention may have a shielding effectiveness of 10 dB or more, preferably 30 dB or more. Specifically, the transparent EMI shielding/absorbing film 30 according to one exemplary embodiment of the present invention may have a shielding effectiveness of 5 dB or more and a light transmittance of 60% or more when electrical conductivities of the conductive metal and the conductive nanowires are in a range of $6.1 \times 10^2$ to $6.1 \times 10^5$ S/cm, a depth of each of the grooves is greater than or equal to 1 μm, an open area ratio is greater than or equal to 60%, and a thickness of the conductive nanowire layer 33 is in a range of 20 to 3,000 nm. Here, the term "open area ratio" is defined as the ratio of the sum of areas of the plurality of grooves with respect to the whole area of the EMI shielding film, expressed as a percentage.

Figure 4:
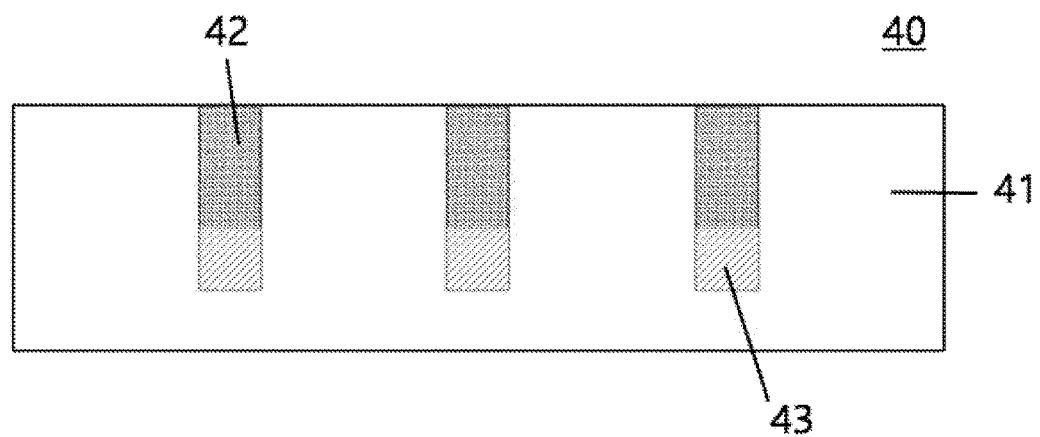
FIG. 4 is a cross-sectional view of a transparent EMI shielding/absorbing film according to one exemplary embodiment of the present invention.

FIG. 4 is a cross-sectional view of a transparent EMI shielding/absorbing film according to one exemplary embodiment of the present invention.

Referring to FIG. 4, a transparent EMI shielding/absorbing film 40 according to one exemplary embodiment of the present invention includes a transparent substrate 41 having a top surface on which a pattern having a plurality of engraved grooves in various shapes is disposed and a conductive layer disposed in the grooves. Here, the conductive layer may be arranged so that a first layer 42 formed of a conductive composite is disposed on a second layer 43 formed of conductive nanowires. A case in which the first layer 42 and the second layer 43 in each of the grooves are alternately disposed once is shown in FIG. 4, but the present invention is not particularly limited thereto. For example, the first layer 42 and the second layer 43 may be alternately disposed two times or more. The transparent substrate 41, the conductive composite, and the conductive nanowires shown in FIG. 4 may be formed of the same materials as the transparent substrate 31, the conductive composite and the conductive nanowires shown in FIG. 3, respectively.

As shown in FIG. 4, since the conductive nanowires may improve shielding effectiveness while exhibiting high light transmission due to the network structure, the second layer 43 formed of the conductive nanowires may be added into each of the grooves to prepare the transparent EMI shielding/absorbing film 40 having high shielding effectiveness while preventing an excessive decrease in light transmittance.

Figure 5:
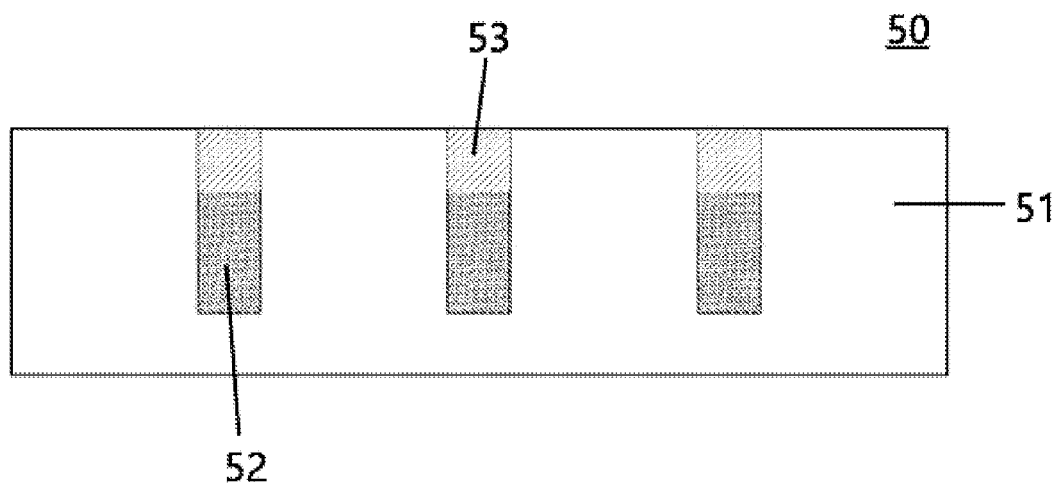
FIG. 5 is a cross-sectional view of a transparent EMI shielding/absorbing film according to one exemplary embodiment of the present invention.

FIG. 5 is a cross-sectional view of a transparent EMI shielding/absorbing film according to one exemplary embodiment of the present invention.

Referring to FIG. 5, a transparent EMI shielding/absorbing film 50 according to one exemplary embodiment of the present invention includes a transparent substrate 51 having a top surface on which a pattern having a plurality of engraved grooves is formed and a conductive layer disposed in the grooves. Here, the conductive layer may be arranged so that a second layer 53 formed of conductive nanowires is disposed on a first layer 52 formed of a conductive composite. A case in which the first layer 52 and the second layer 53 in each of the grooves are alternately disposed once is shown in FIG. 5, but the present invention is not particularly limited thereto. For example, the first layer 52 and the second layer 53 may be alternately disposed two times or more. The transparent substrate 51, the conductive composite and the conductive nanowires shown in FIG. 5 may be formed of the same materials as the transparent substrate 31, the conductive composite and the conductive nanowires shown in FIG. 3, respectively.

Figure 6:
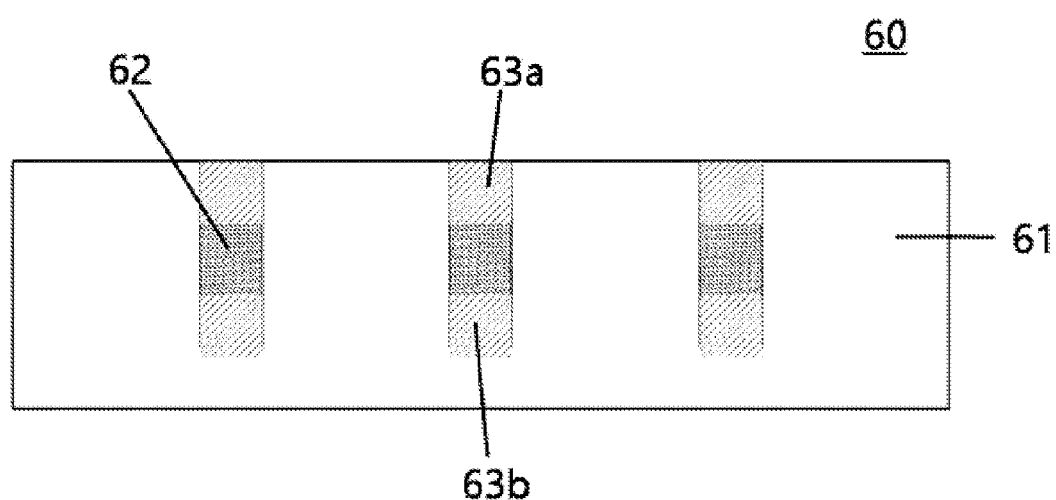
FIG. 6 is a cross-sectional view of a transparent EMI shielding/absorbing film according to one exemplary embodiment of the present invention.

FIG. 6 is a cross-sectional view of a transparent EMI shielding/absorbing film according to one exemplary embodiment of the present invention.

Referring to FIG. 6, a transparent EMI shielding/absorbing film 60 according to one exemplary embodiment of the present invention includes a transparent substrate 61 having a top surface on which a pattern having a plurality of engraved grooves is formed and a conductive layer disposed in the grooves. Here, the conductive layer may be arranged so that a first layer 62 formed of a conductive material is disposed on a second layer 63b formed of conductive nanowires and a third layer 63a formed of conductive nanowires is again disposed on the first layer 62. The transparent substrate 61, the conductive material and the conductive nanowires shown in FIG. 6 may be formed of the same materials as the transparent substrate 31, the conductive material and the conductive nanowires shown in FIG. 3, respectively.

Figure 7:
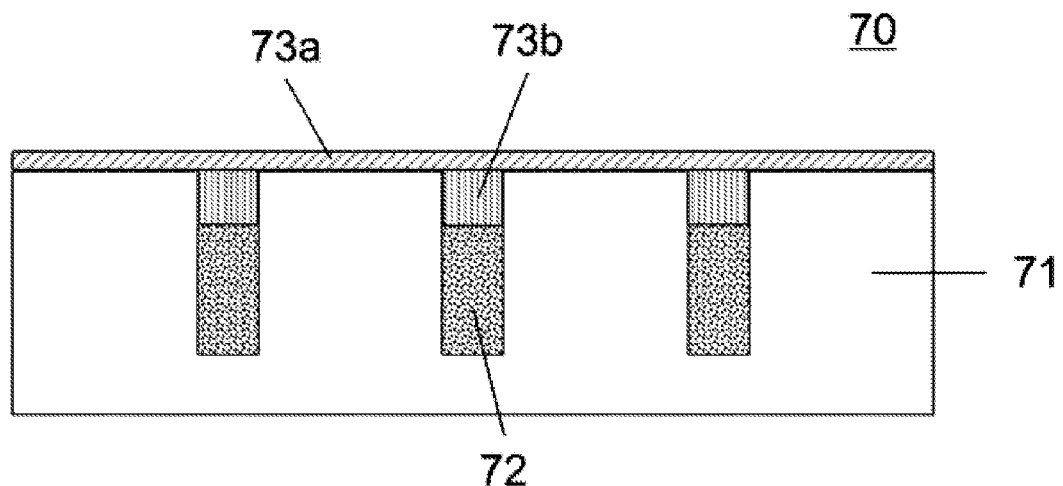
FIG. 7 is a cross-sectional view of a transparent EMI shielding/absorbing film according to one exemplary embodiment of the present invention.

FIG. 7 is a cross-sectional view of a transparent EMI shielding/absorbing film according to one exemplary embodiment of the present invention.

Referring to FIG. 7, a transparent EMI shielding/absorbing film 70 according to one exemplary embodiment of the present invention includes a transparent substrate 71 having a top surface on which a pattern having a plurality of engraved grooves is formed, a conductive layer disposed in the grooves, and a conductive nanowire layer 73a disposed on the top surface of the transparent substrate 71 and electrically connected with the conductive layer. Here, the conductive layer may be arranged so that a second layer 73b formed of conductive nanowires is disposed on a first layer 72 formed of a conductive material. The transparent substrate 71, the conductive material and the conductive nanowires shown in FIG. 7 may be formed of the same materials as the transparent substrate 31, the conductive material and the conductive nanowires shown in FIG. 3, respectively.

Figure 8:
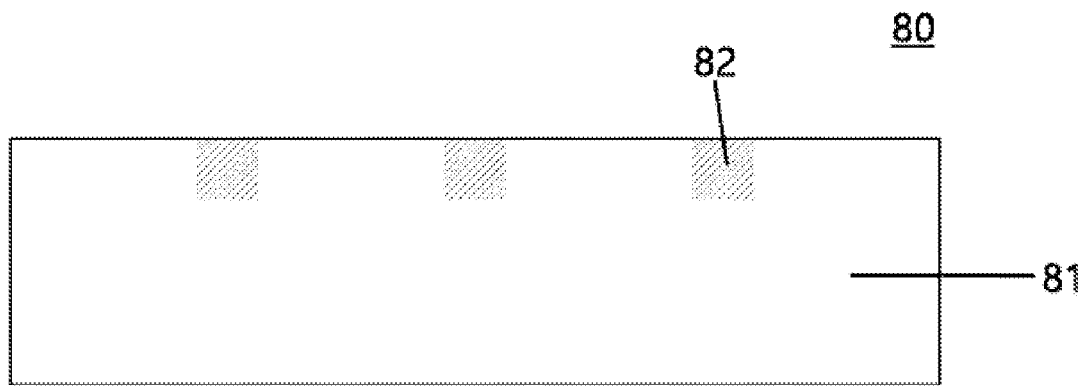
FIG. 8 is a cross-sectional view of a transparent EMI shielding/absorbing film according to one exemplary embodiment of the present invention.

FIG. 8 is a cross-sectional view of a transparent EMI shielding/absorbing film according to one exemplary embodiment of the present invention.

Referring to FIG. 8, a transparent EMI shielding/absorbing film 80 according to one exemplary embodiment of the present invention includes a transparent substrate 81 having a top surface on which a pattern having a plurality of engraved grooves is formed and a conductive layer 82 disposed in the groove. Here, the conductive layer 82 may be formed of conductive nanowires. The transparent substrate 81 and the conductive nanowires shown in FIG. 8 may be formed of the same materials as the transparent substrate 31 and the conductive nanowires shown in FIG. 3 respectively.

Figure 9:
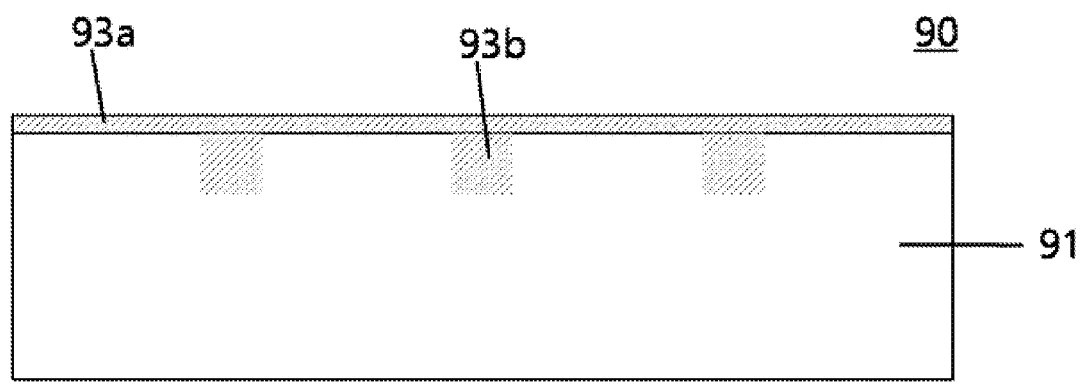
FIG. 9 is a cross-sectional view of a transparent EMI shielding/absorbing film according to one exemplary embodiment of the present invention.

FIG. 9 is a cross-sectional view of a transparent EMI shielding/absorbing film according to one exemplary embodiment of the present invention.

Referring to FIG. 9, a transparent EMI shielding/absorbing film 90 according to one exemplary embodiment of the present invention includes a transparent substrate 91 having a top surface on which a pattern having a plurality of engraved grooves is formed, a conductive layer 93b disposed in the grooves, and a conductive nanowire layer 93a disposed on the top surface and electrically connected with the conductive layer 93b. Here, the conductive layer 93b may be formed of conductive nanowires. The transparent substrate 91 and the conductive nanowires shown in FIG. 9 may be formed of the same materials as the transparent substrate 31 and the conductive nanowires shown in FIG. 3, respectively.

Figure 10:
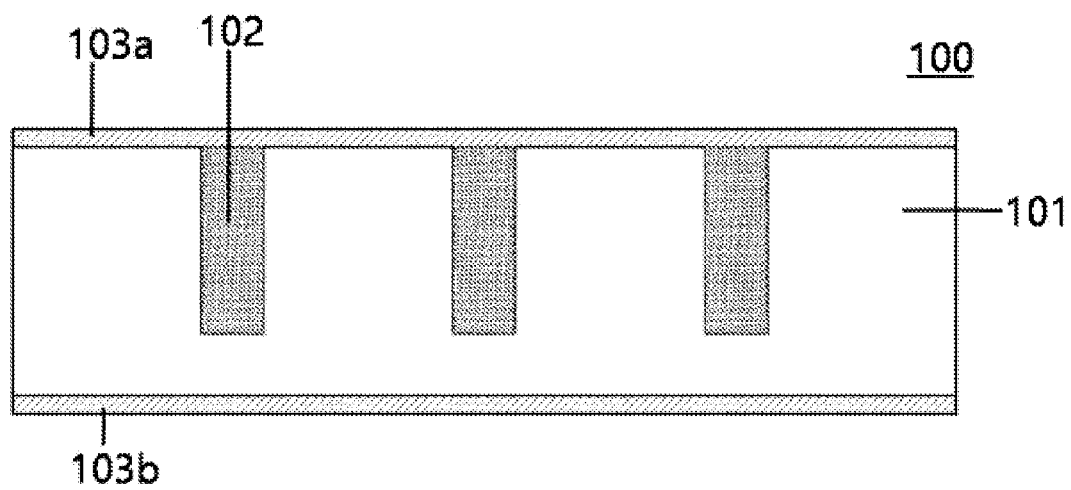
FIG. 10 is a cross-sectional view of a transparent EMI shielding/absorbing film according to one exemplary embodiment of the present invention.

FIG. 10 is a cross-sectional view of a transparent EMI shielding/absorbing film according to one exemplary embodiment of the present invention.

Referring to FIG. 10, a transparent EMI shielding/absorbing film 100 according to one exemplary embodiment of the present invention includes a transparent substrate 101 having a top surface on which a pattern having a plurality of engraved grooves is formed, a conductive layer 102 disposed in the grooves, a first conductive nanowire layer 103a disposed on the top surface of transparent substrate 101 and electrically connected with the conductive layer 102, and a second conductive nanowire layer 103b disposed on a bottom surface facing the top surface of the transparent substrate 101. The transparent substrate 101 and the conductive nanowires shown in FIG. 10 may be formed of the same materials as the transparent substrate 31 and the conductive nanowires shown in FIG. 3, respectively.

Figure 11:
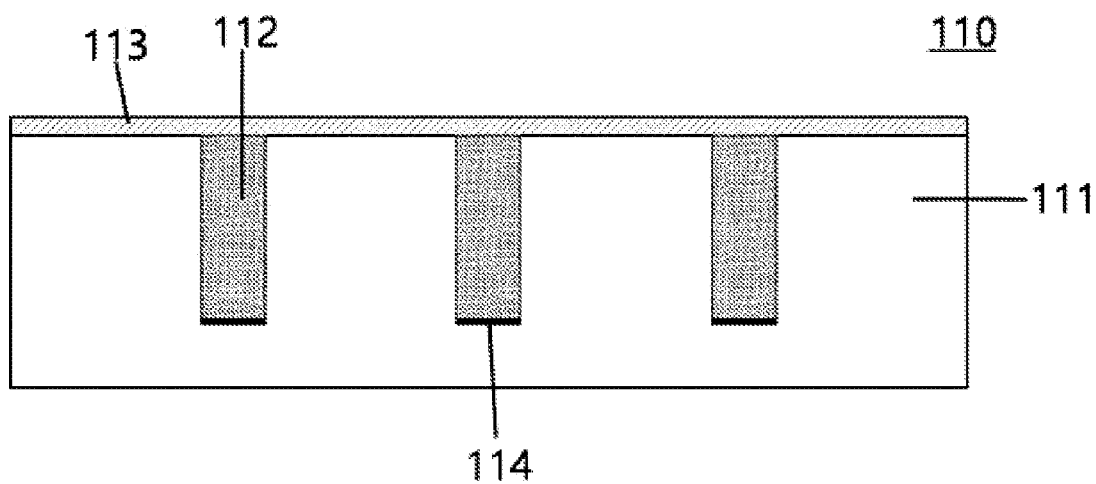
FIG. 11 is a cross-sectional view of a transparent EMI shielding/absorbing film according to one exemplary embodiment of the present invention.

FIG. 11 is a cross-sectional view of a transparent EMI shielding/absorbing film according to one exemplary embodiment of the present invention.

Referring to FIG. 11, a transparent EMI shielding/absorbing film 110 according to one exemplary embodiment of the present invention includes a transparent substrate 111 having a top surface on which a pattern having a plurality of engraved grooves is formed, a conductive layer 112 disposed in the grooves and formed of a conductive material, a conductive nanowire layer 113 disposed on the top surface of the transparent substrate 111 and electrically connected with the conductive layer 112, and a black matrix 114 in contact with base sides of the grooves. The black matrix 114 may enhance light transmittance by preventing diffuse reflection of light. Also, films including a black matrix have effects of improving contrast and reducing haze. The transparent substrate 111, the conductive material and the conductive nanowires shown in FIG. 11 may be formed of the same materials as the transparent substrate 31, the conductive material and the conductive nanowires shown in FIG. 3, respectively.

Figure 12:
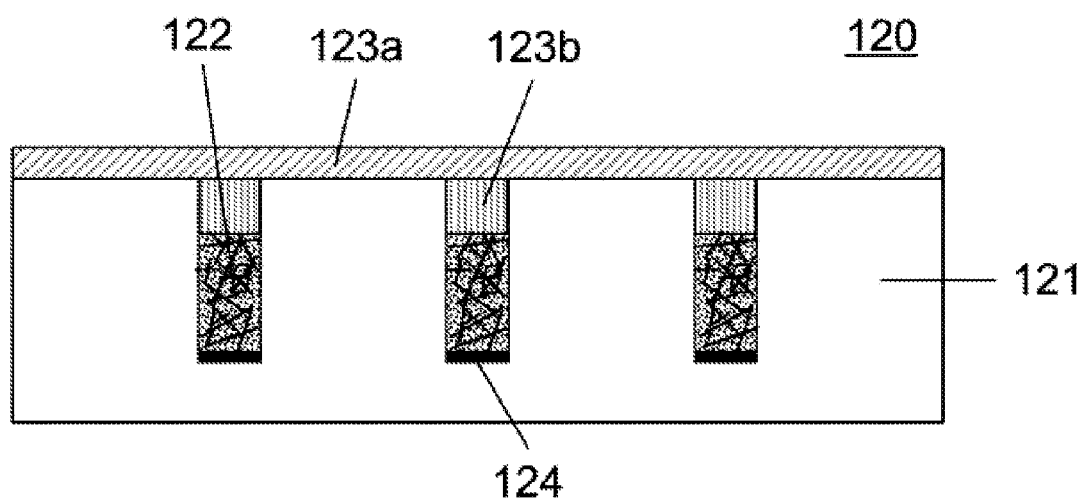
FIG. 12 is a cross-sectional view of a transparent EMI shielding/absorbing film according to one exemplary embodiment of the present invention.

FIG. 12 is a cross-sectional view of a transparent EMI shielding/absorbing film according to one exemplary embodiment of the present invention.

Referring to FIG. 12, a transparent EMI shielding/absorbing film 120 according to one exemplary embodiment of the present invention includes a transparent substrate 121 having a top surface on which a pattern having a plurality of engraved grooves is formed, a conductive layer disposed in the grooves, a conductive nanowire layer 123a disposed on the top surface of the transparent substrate 121 and electrically connected with the conductive layer, and a black matrix 124 in contact with base sides of the grooves. Here, the conductive layer may be arranged so that a second layer 123b formed of conductive nanowires is disposed on a first shielding/absorbing layer 122 formed of a conductive material including conductive nanowires. The transparent substrate 121, the conductive material and the conductive nanowires shown in FIG. 12 may be formed of the same materials as the transparent substrate 31, the conductive material and the conductive nanowires shown in FIG. 3, respectively.

Hereinafter, the present invention will be described in further detail with reference to Examples and Experimental Examples of the transparent EMI shielding/absorbing films according to one exemplary embodiment of the present invention. However, it should be understood that the Examples and Experimental Examples of the present invention will be described in further detail for the purpose of describing the present invention and are not intended to limit the present invention.

Examples 1 to 6

Transparent EMI shielding/absorbing films of Examples 1 to 6 were designed to have the same structure as the transparent EMI shielding/absorbing film shown in FIG. 3, except that the transparent EMI shielding/absorbing films had specifications as listed in the following Table 1. Thereafter, the transparent EMI shielding/absorbing films were computer simulated. In all Examples 1 to 6, the electrical conductivity of a conductive material was set to $6.1 \times 10^5$ S/m, and the thickness of a conductive nanowire layer was set to 50 nm.

TABLE 1

|  | Opening diameter (μm) | Line width (μm) | Open area ratio (%) |
|---|---|---|---|
| Example 1 | 120 | 10 | 85.24 |
| Example 2 | 150 | 20 | 77.78 |
| Example 3 | 200 | 10 | 90.72 |
| Example 4 | 200 | 20 | 82.63 |
| Example 5 | 250 | 25 | 82.70 |
| Example 6 | 250 | 30 | 79.70 |

Figure 13:
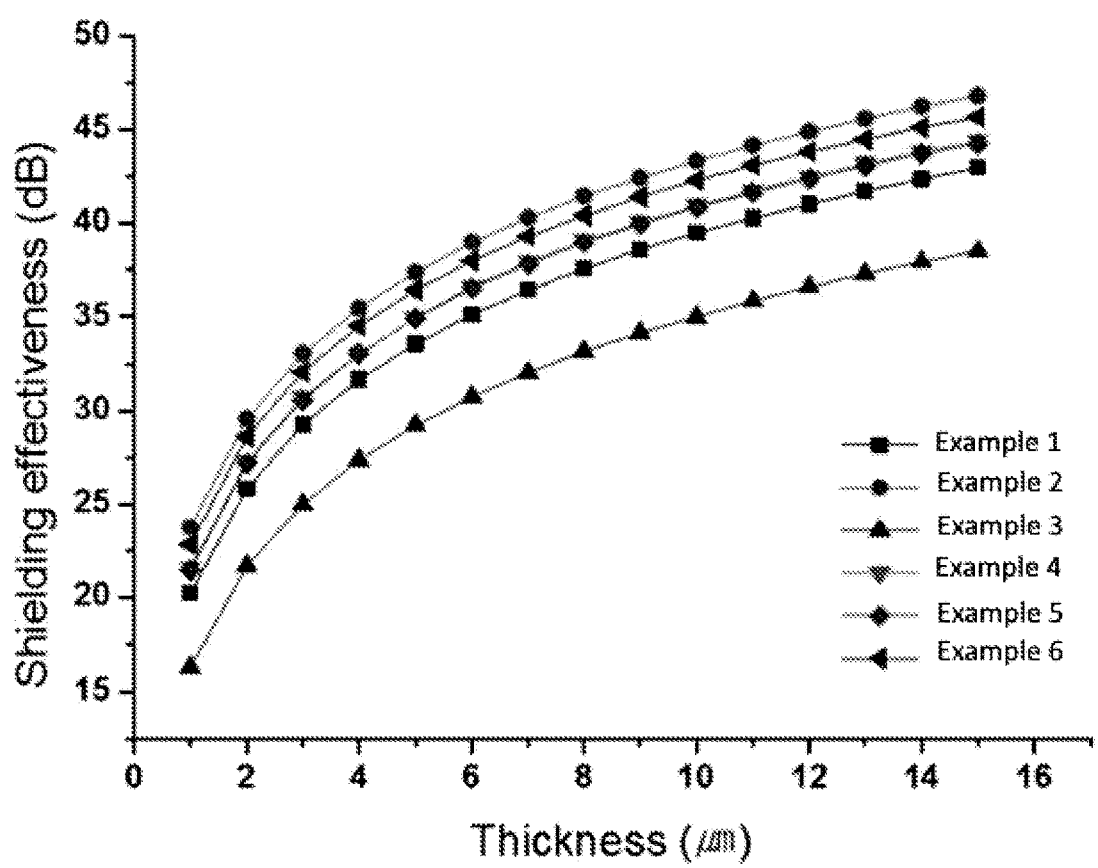
FIG. 13 shows results of a computer simulation of changes in shielding effectiveness of transparent EMI shielding/absorbing films of Examples 1 to 6 according to thickness of a conductive layer.

FIG. 13 shows results of a computer simulation of change in shielding effectiveness of the transparent EMI shielding/absorbing films of Examples 1 to 6 according to thickness of the conductive layer.

Referring to FIG. 13, it can be seen that the shielding effectiveness decreases with increasing open area ratio, and the shielding effectiveness improves with increasing thickness of the conductive layer.

Example 7

A transparent EMI shielding/absorbing film was designed to have the same structure as the transparent EMI shielding/absorbing film shown in FIG. 3, except that the opening diameter and line width were set to 250 μm and 20 μm, respectively, so that the open area ratio was 85.86%. The thickness of the transparent EMI shielding/absorbing film was set to 10 μm, and the electrical conductivity of a conductive composite was set to $6.1 \times 10^5$ S/m.

The transparent EMI shielding/absorbing films of Examples 1 to 6 were designed to have specifications as listed in the above Table 1, and a computer simulation was done. In all Examples 1 to 6, the electrical conductivity of the conductive material was set to $6.1 \times 10^5$ S/m, and the conductive nanowire layer was set as a silver nanowire layer.

Figure 14:
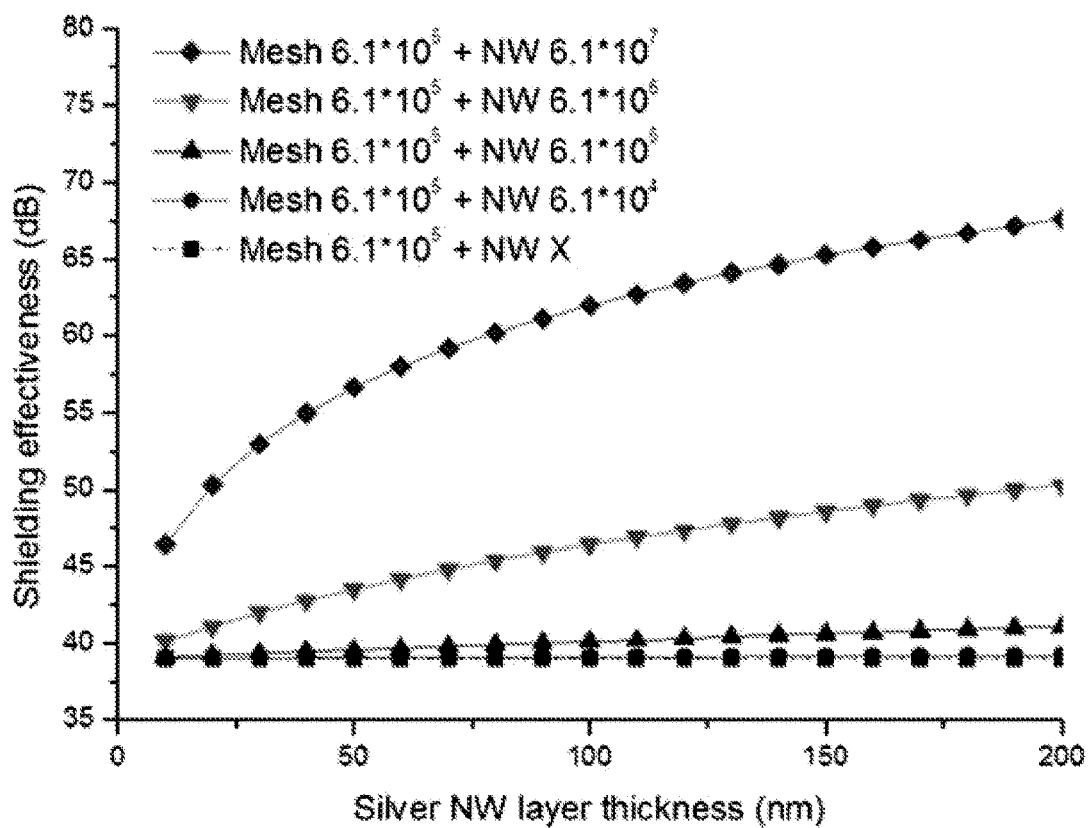
FIG. 14 shows results of a computer simulation of change in shielding effectiveness of a transparent EMI shielding/absorbing film of Example 7 according to changing thickness and electrical conductivity of a silver nanowire layer.

FIG. 14 shows results of a computer simulation of change in shielding effectiveness of the transparent EMI shielding/absorbing film of Example 7 according to changing thickness and electrical conductivity of the silver nanowire layer.

Referring to FIG. 14, it can be seen that, when the silver nanowires formed on the conductive layer has an electrical conductivity of $6.1 \times 10^4$ S/m, no changes in shielding effectiveness according to increasing thickness of the silver nanowire layer were observed as if there was no silver nanowire layer (Only mesh type film), but the shielding effectiveness improved with increasing thickness of the silver nanowire layer when the silver nanowires has electrical conductivities (i.e., sliver NW conductivities) of $6.1 \times 10^5$ S/m, $6.1 \times 10^6$ S/m, and $6.1 \times 10^7$ S/m. Also, it can be seen that, when the silver nanowire layer has the same thickness, the shielding effectiveness is better with enhanced electrical conductivity of the silver nanowires.

Example 8

A transparent EMI shielding/absorbing film was computer simulated under the same conditions of Example 7, except that the opening diameter was set to 400 μm so that the open area ratio was 90.63%.

Figure 15:
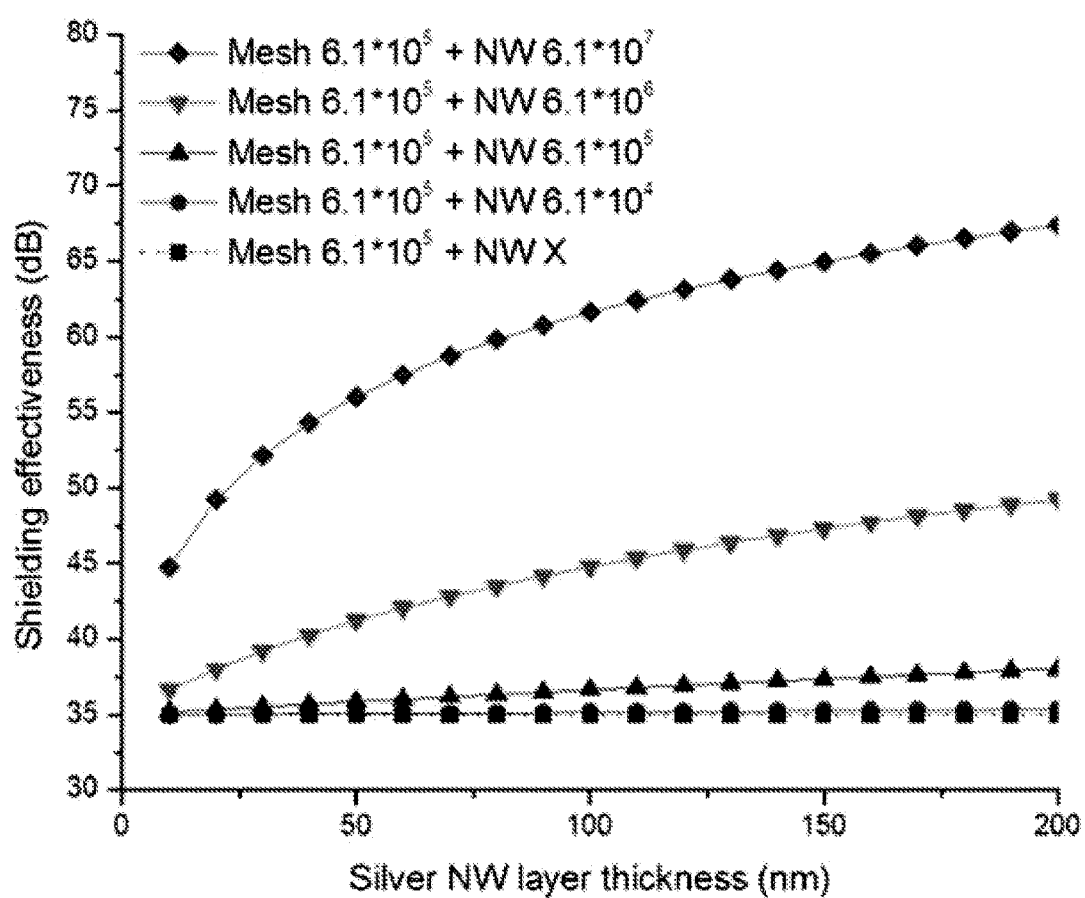
FIG. 15 shows results of a computer simulation of change in shielding effectiveness of a transparent EMI shielding/absorbing film of Example 8 according to changing thickness and electrical conductivity of a silver nanowire.

FIG. 15 shows results of a computer simulation of change in shielding effectiveness of the transparent EMI shielding/absorbing film of Example 8 according to changing thickness and electrical conductivity of the silver nanowire layer.

Referring to FIG. 15, it can be seen that, when the silver nanowires formed on the conductive layer has an electrical conductivity of $6.1 \times 10^4$ S/m, no changes in shielding effectiveness with increasing thickness of the silver nanowire layer were observed as if there was no silver nanowire layer (Only mesh type film), but the shielding effectiveness improved with increasing thickness of the silver nanowire layer when the silver nanowires has electrical conductivities (i.e., sliver NM conductivities) of $6.1 \times 10^5$ S/m, $6.1 \times 10^6$ S/m, and $6.1 \times 10^7$ S/m. Also, it can be seen that, when the silver nanowire layer has the same thickness, the shielding effectiveness is better with enhanced electrical conductivity of the silver nanowires.

Example 9

A transparent EMI shielding/absorbing film was designed to have the same structure as the transparent EMI shielding/absorbing film shown in FIG. 3, except that the opening diameter and line width were set to 250 μm and 25 μm, respectively, the electrical conductivity of the conductive material was set to $6.1 \times 10^4$ S/m, and the thickness of the silver nanowire layer was set to 40 nm.

Figure 16:
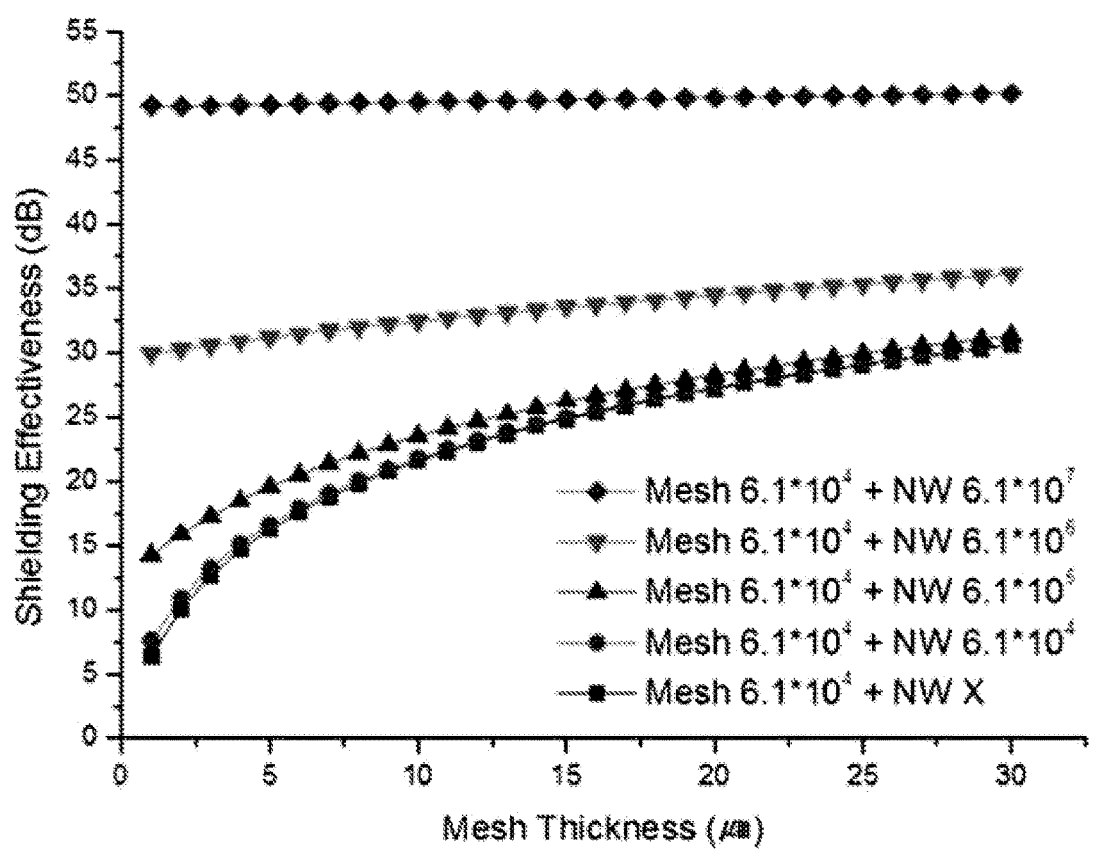
FIG. 16 shows results of a computer simulation of change in shielding effectiveness of a transparent EMI shielding/absorbing film of Example 9 according to changing thickness (i.e., a mesh thickness) of a conductive layer and changing electrical conductivity of a silver nanowire layer.

FIG. 16 shows results of a computer simulation of a change in shielding effectiveness of the transparent EMI shielding/absorbing film of Example 9 according to changing thickness (i.e., a mesh thickness) of the conductive layer and changing electrical conductivity of the silver nanowire layer.

Referring to FIG. 16, it can be seen that, when the transparent EMI shielding/absorbing film has no silver nanowire layer or the silver nanowires has electrical conductivities of $6.1 \times 10^4$ S/m, $6.1 \times 10^5$ S/m, and $6.1 \times 10^6$ S/m, the shielding effectiveness improves with increasing thickness of the conductive layer, but the shielding effectiveness hardly improves with increasing thickness of the conductive layer when the silver nanowire layer has an electrical conductivity of $6.1 \times 10^7$ S/m. Also, it can be seen that, when the conductive layer has the same thickness, the shielding effectiveness is better with enhanced electrical conductivity of the silver nanowire layer.

Example 10

A computer simulation was performed under the same conditions of Example 9, except that the electrical conductivity of the conductive material was set to $6.1 \times 10^7$ S/m.

Figure 17:
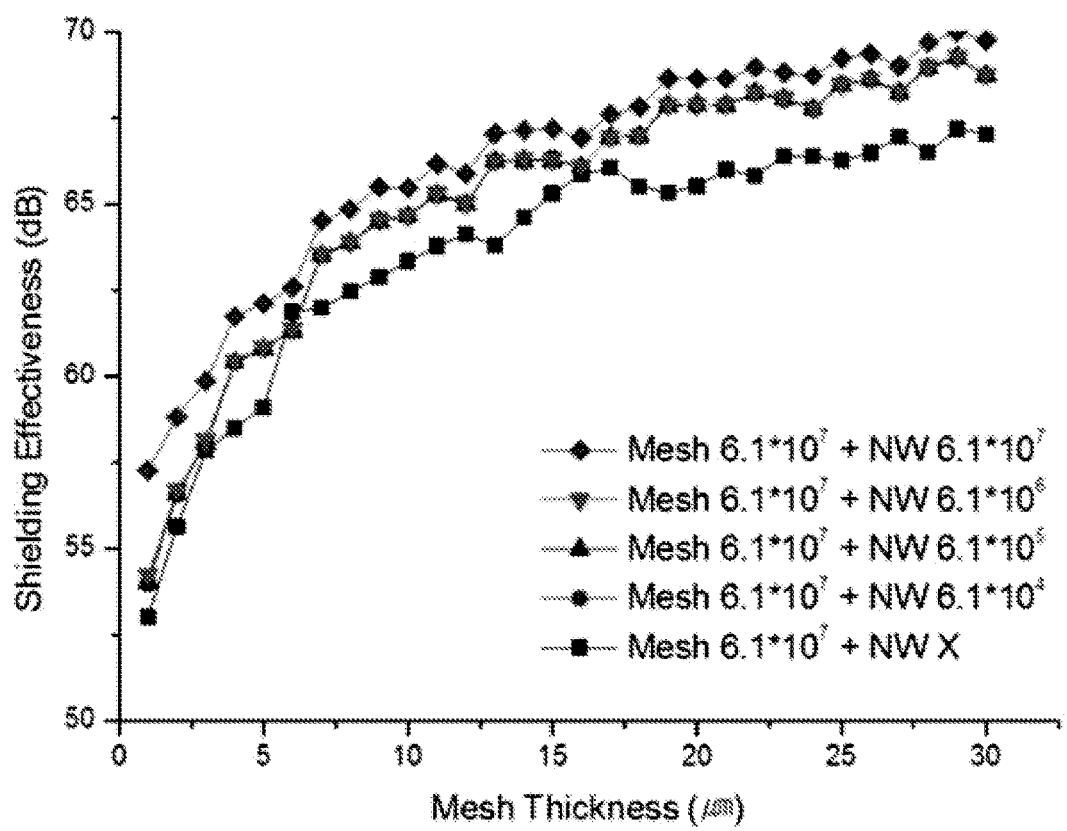
FIG. 17 shows results of a computer simulation of change in shielding effectiveness of a transparent EMI shielding/absorbing film of Example 10 according to changing thickness of a conductive layer and changing in electrical conductivity of a silver nanowire layer.

FIG. 17 shows results of a computer simulation of a change in shielding effectiveness of the transparent EMI shielding/absorbing film of Example 10 according to changing thickness (i.e., a mesh thickness) of the conductive layer and changing electrical conductivity of the silver nanowire layer.

Referring to FIG. 17, it can be seen that the shielding effectiveness is enhanced with increasing thickness of the conductive layer, but the extent of increase in shielding effectiveness according to increasing electrical conductivity of the silver nanowire layer is lower than that of Example 9.

Example 11

A transparent EMI shielding/absorbing film was designed to have the same structure as the transparent EMI shielding/absorbing film shown in FIG. 4, except that the opening diameter and line width were set to 250 μm and 25 μm, respectively, the thickness of the first layer formed of the conductive material was set to 10 μm, the electrical conductivity of the conductive material was set to $6.1 \times 10^5$ S/m, and the second layer formed of the silver nanowires (i.e., a silver NW layer) was set to 200 nm. Thereafter, the transparent EMI shielding/absorbing film was computer simulated.

Figure 18:
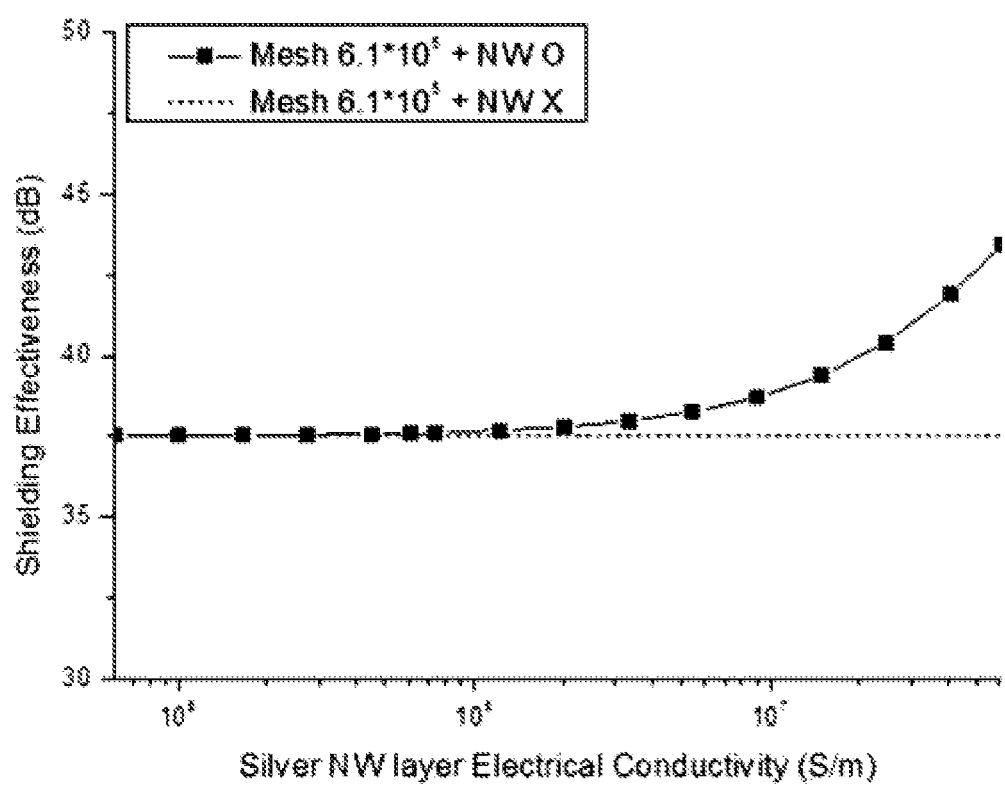
FIG. 18 shows results of a computer simulation of change in shielding effectiveness of a conductive layer of Example 11 (Mesh Only) which includes only a first layer formed of a conductive material with increasing electrical conductivity of a second layer formed of silver nanowires.

FIG. 18 shows results of a computer simulation of change in shielding effectiveness of the conductive layer of Example 11 (Mesh Only), which includes only the first layer formed of the conductive material, according to increasing electrical conductivity of the second layer formed of the silver nanowires.

Referring to FIG. 18, it can be seen that the shielding effectiveness is enhanced with enhanced electrical conductivity of the second layer formed of the silver nanowires.

Example 12

A transparent EMI shielding/absorbing film was designed to have the same structure as the transparent EMI shielding/absorbing film shown in FIG. 8, except that the opening diameter and line width were set to 150 μm and 10 μm, respectively, and the thickness of the conductive layer formed of the silver nanowires was set to 40 nm. Thereafter, the transparent EMI shielding/absorbing film was computer simulated.

Figure 19:
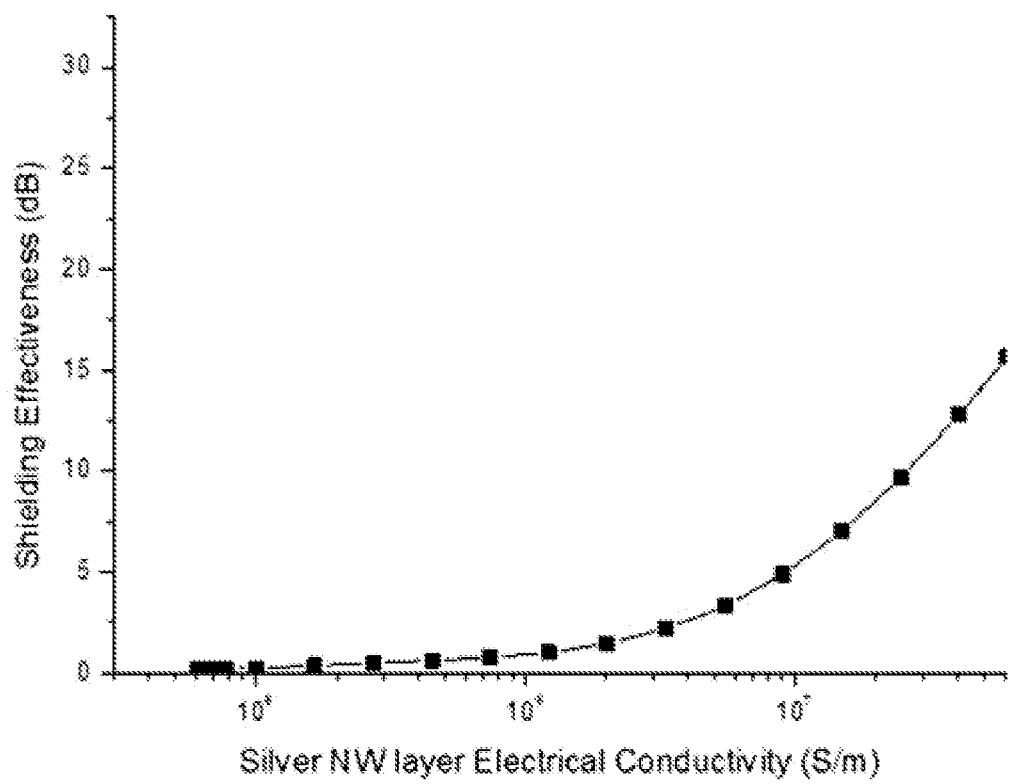
FIG. 19 shows results of a computer simulation of change in shielding effectiveness of a conductive layer of Example 12 with increasing electrical conductivity of the conductive layer.

FIG. 19 shows results of a computer simulation of change in shielding effectiveness of the conductive layer of Example 12 according to increasing electrical conductivity of the conductive layer.

Referring to FIG. 19, it can be seen that the shielding effectiveness improves with enhanced electrical conductivity of the conductive layer formed of the silver nanowires.

Example 13

A computer simulation was performed in the same manner as in Example 12, except that the thickness of the conductive layer formed of the silver nanowires was set to 200 nm.

Figure 20:
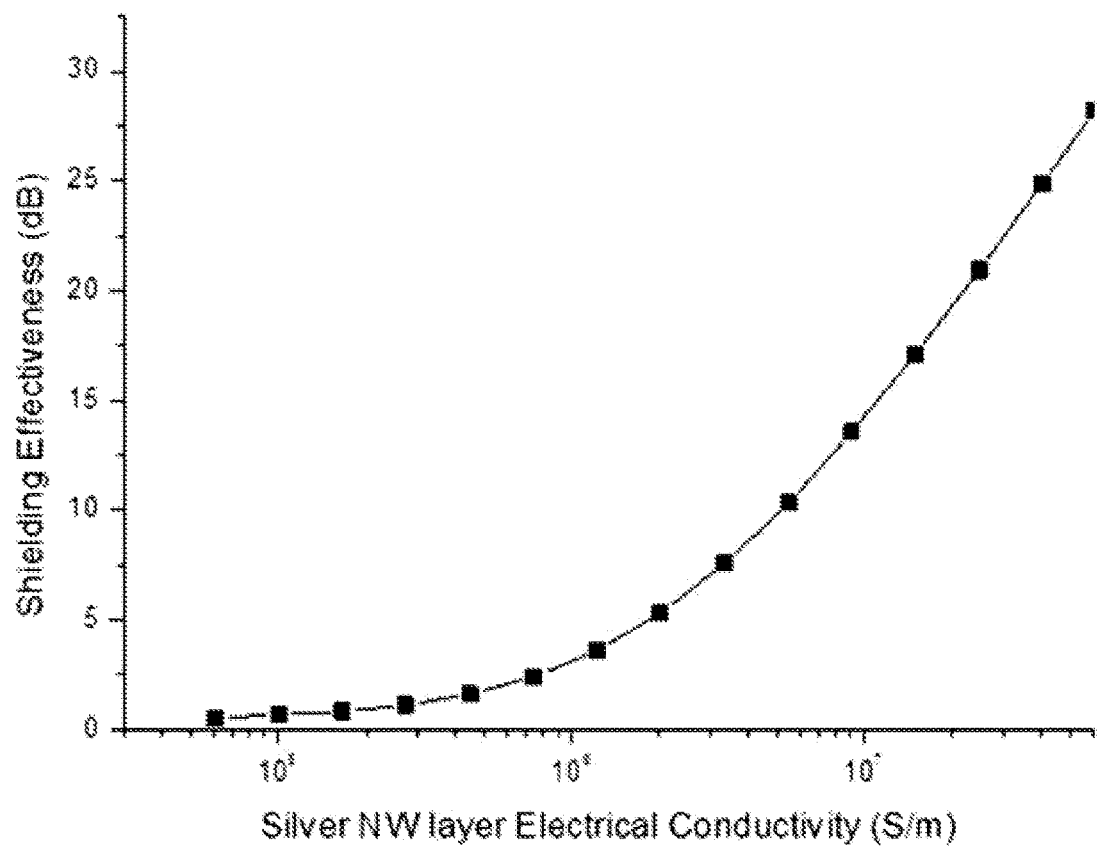
FIG. 20 shows results of a computer simulation of change in shielding effectiveness of a conductive layer of Example 13 with increasing electrical conductivity of the conductive layer.

FIG. 20 shows results of a computer simulation of change in shielding effectiveness of the conductive layer of Example 13 according to increasing electrical conductivity of the conductive layer.

Referring to FIG. 20, it can be seen that the shielding effectiveness improves with increasing electrical conductivity of the conductive layer formed of the silver nanowires. Also, it can be seen that, when the silver nanowires has the same electrical conductivity, the shielding effectiveness improves with increasing thickness of the conductive layer compared to that of FIG. 19.

Example 14

A transparent EMI shielding/absorbing film was designed to have the same structure as the transparent EMI shielding/absorbing film shown in FIG. 10, except that the opening diameter and line width were set to 400 μm and 20 μm, respectively, so that the open area ratio was 90.63%, the electrical conductivity of the conductive layer was set to $6.1 \times 10^5$ S/m, and the total thickness of the transparent EMI shielding/absorbing film was set to 10 nm. Thereafter, the transparent EMI shielding/absorbing film was computer simulated.

Figure 21:
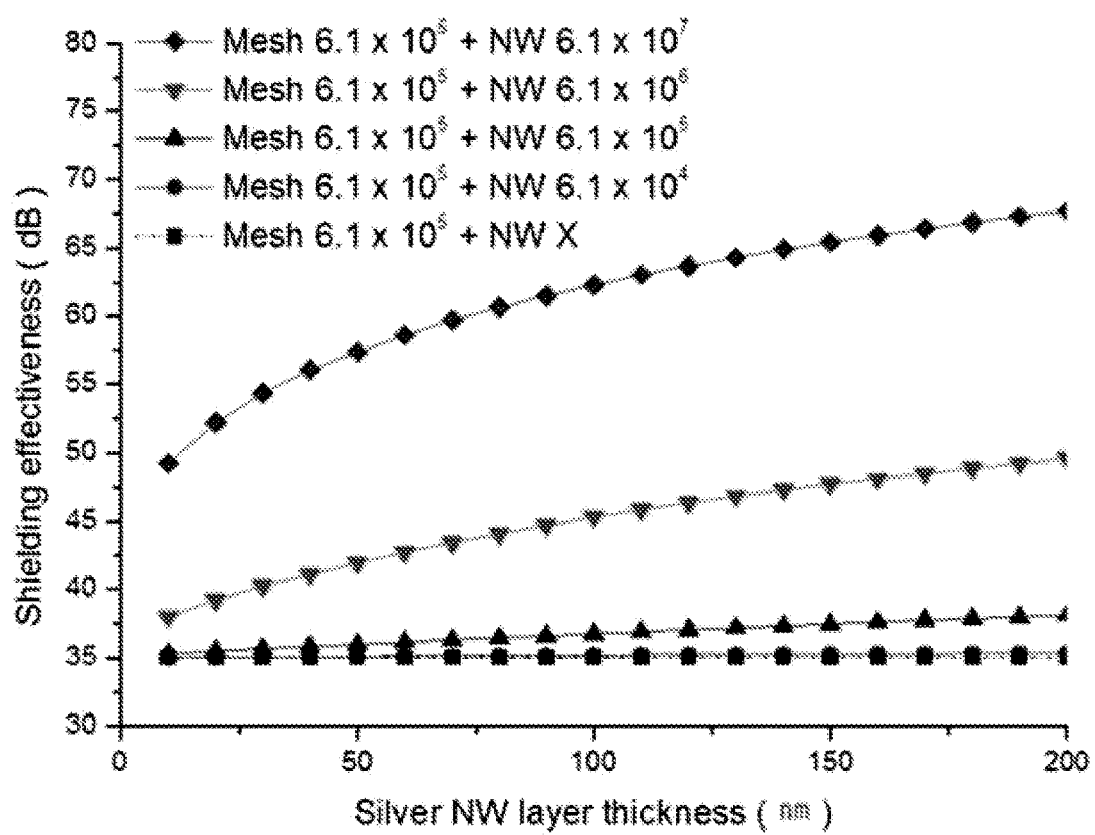
FIG. 21 shows results of a computer simulation of change in shielding effectiveness of a transparent EMI shielding/absorbing film of Example 14 according to changing thickness and electrical conductivity of a silver nanowire layer.

FIG. 21 shows results of a computer simulation of change in shielding effectiveness of the transparent EMI shielding/absorbing film of Example 14 according to changing thickness and electrical conductivity of the silver nanowire layer.

Referring to FIG. 21, it can be seen that, when the silver nanowire layer has an electrical conductivity of $6.1 \times 10^4$ S/m, the shielding effectiveness slightly changed as the thickness of the silver nanowire layer was increased, but the shielding effectiveness improves with increasing thickness of the silver nanowire layer when the silver nanowire layer has electrical conductivities of $6.1 \times 10^5$ S/m, $6.1 \times 10^6$ S/m, and $6.1 \times 10^7$ S/m. Also, it can be seen that, when the silver nanowire layer has the same thickness, the shielding effectiveness is better with enhanced electrical conductivity of the silver nanowire layer.

Experimental Example 1: Measurement of Changes in EMI Shielding Performance

Figure 1:
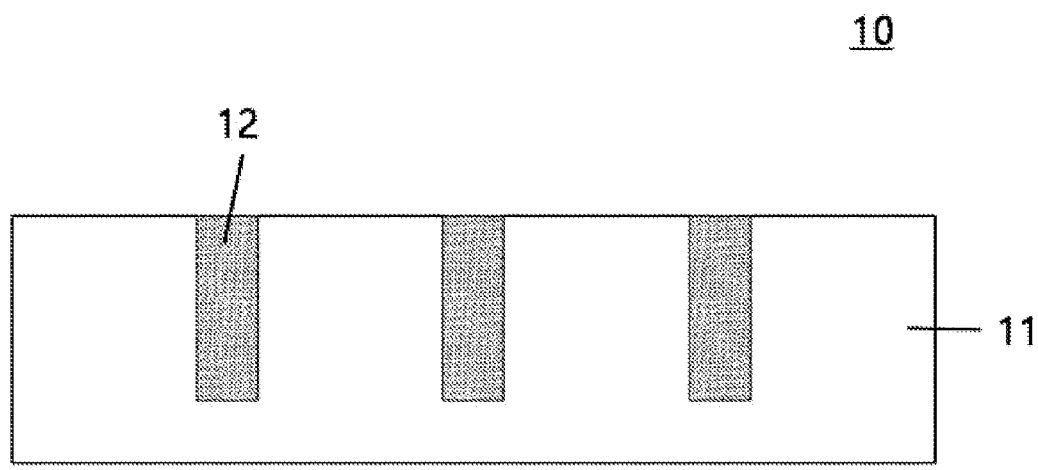
FIG. 1 is a cross-sectional view of a conventional mesh-type transparent EMI shielding film.
Figure 2:
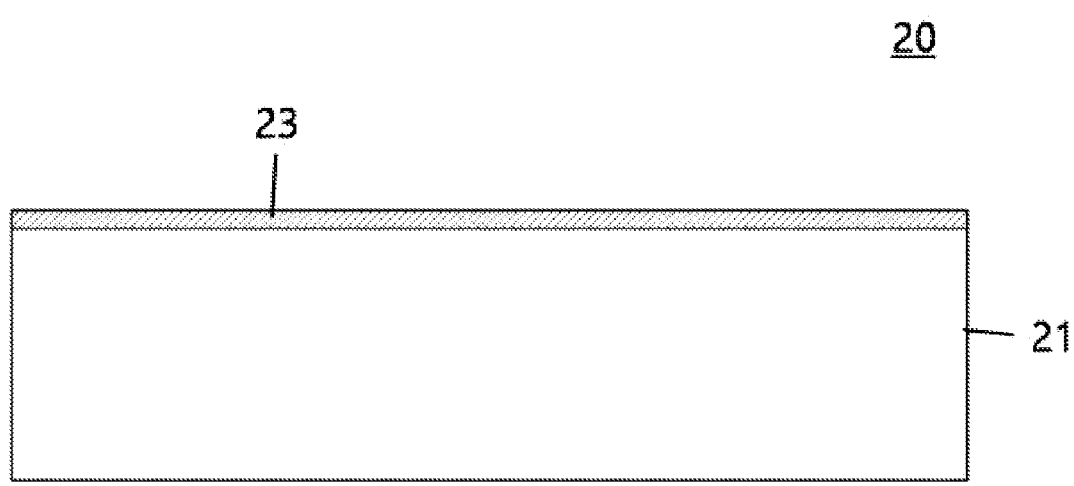
FIG. 2 is a cross-sectional view of a conventional conductive film-type transparent EMI shielding film.

The EMI shielding abilities of the transparent EMI shielding film 10 shown in FIG. 1 and the transparent EMI shielding/absorbing film 70 shown in FIG. 7 were measured and compared while changing measurement frequency. Both the transparent EMI shielding film and shielding and absorbing films 10 and 70 shown in FIGS. 1 and 7 respectively were measured to have an opening diameter of 250 μm and a line width of 25 μm, and the conductive composite was measured to have an electrical conductivity value of $7.7 \times 10^5$ S/m, and the silver nanowires were measured to have an electrical conductivity value of $1.0 \times 10^7$ S/m. The conductive layer of the transparent EMI shielding film 10 shown in FIG. 1 was measured to have a thickness of 7 μm, and the first layer 72 of the transparent EMI shielding/absorbing film 70 shown in FIG. 7 and formed of the conductive material was measured to have a thickness of 7 μm. Also, the second layer 73b formed of the conductive nanowires and the conductive nanowire layer 73a were measured to have thicknesses of 300 nm and 100 nm, respectively.

Experimental Example 2: Measurement of Changes in EMI Shielding Performance

The EMI shielding abilities of the transparent EMI shielding film 10 shown in FIG. 1 and the transparent EMI shielding/absorbing film 70 shown in FIG. 7 were measured and compared while changing measurement frequency. Both the transparent EMI shielding film and shielding and absorbing films 10 and 70 shown in FIGS. 1 and 7 respectively were measured to have an opening diameter of 150 μm and a line width of 10 μm, the conductive material was measured to have an electrical conductivity value of $7.7 \times 10^5$ S/m, and the silver nanowires were measured to have an electrical conductivity of value $7.0 \times 10^6$ S/m. The conductive layer of the transparent EMI shielding film 10 shown in FIG. 1 was measured to have a thickness of 12 μm, and the first layer 72 of the transparent EMI shielding/absorbing film 70 shown in FIG. 7 and formed of the conductive material was measured to have a thickness of 12 μm. Also, the second layer 73b formed of the conductive nanowires and the conductive nanowire layer 73a were measured to have thicknesses of 200 nm and 100 nm, respectively.

Experimental Example 3: Measurement of Changes in EMI Shielding Performance

The EMI shielding abilities of the transparent EMI shielding film 10 shown in FIG. 1 and the transparent EMI shielding/absorbing film 70 shown in FIG. 7 were measured and compared while changing measurement frequency. Both the transparent EMI shielding film and shielding and absorbing films 10 and 70 shown in FIGS. 1 and 7 respectively were measured to have an opening diameter 150 μm and a line width of 10 μm, the conductive material was measured to have an electrical conductivity value of $7.7 \times 10^5$ S/m, and the silver nanowires were measured to have an electrical conductivity of $6.1 \times 10^6$ S/m. The conductive layer of the transparent EMI shielding film 10 shown in FIG. 1 was measured to have a thickness of 4 μm, and the first layer 72 of the transparent EMI shielding/absorbing film 70 shown in FIG. 7 and formed of the conductive composite was measured to have a thickness of 4 μm. Also, the second layer 73b formed of the conductive nanowires and the conductive nanowire layer 73a were measured to have thicknesses of 150 nm and 100 nm, respectively.

Experimental Example 4: Measurement of Change in EMI Shielding Performance

The EMI shielding ability of the transparent EMI shielding/absorbing film 120 shown in FIG. 12 was measured while changing measurement frequency. The transparent EMI shielding/absorbing film 120 shown in FIG. 12 was measured to have an opening diameter of 150 μm and a line width of 10 μm, the conductive material including the carbon nanowires was measured to have an electrical conductivity of $9.8 \times 10^5$ S/m, and the silver nanowires was measured to have an electrical conductivity of $7.0 \times 10^6$ S/m. The black matrix layer 124 formed in the grooves was measured to have a thickness of approximately 2 μm, and the first layer 122 of the transparent EMI shielding/absorbing film 120 shown in FIG. 12 and formed of a conductive composite including silver particles with shape anisotropy and carbon nanowires was measured to have a thickness of 12 μm. Also, the second layer 123b formed of the conductive nanowire and the conductive nanowire layer 123a were measured to have thicknesses of 100 nm and 200 nm, respectively.

Table 2 summarizes the conditions for the transparent EMI shielding film shown in FIG. 1 and the transparent EMI shielding/absorbing films shown in FIGS. 7 and 12, which were used in Experimental Examples 1 to 4.

TABLE 2

| | Experimental Examples | | | | | | |
|---|---|---|---|---|---|---|---|
| | 1 | | 2 | | 3 | | 4 |
| | FIG 1 | FIG 7 | FIG 1 | FIG 7 | FIG 1 | FIG 7 | FIG 7 |
| Opening diameter (μm) | 250 | | 150 | | 150 | | 150 |
| Line width (μm) | 25 | | 10 | | 10 | | 10 |
| Electrical conductivity (S/m) of conductive composite | $7.7 \times 10^5$ | | $7.7 \times 10^5$ | | $7.7 \times 10^5$ | | $9.8 \times 10^5$ |
| Electrical conductivity (S/m) of silver nanowire layer | $1.0 \times 10^7$ | | $7.0 \times 10^6$ | | $6.1 \times 10^6$ | | $7.0 \times 10^6$ |
| Thickness (μm) of conductive layer | 7 | | 12 | | 4 | | |
| Thickness (μm) of first layer | | 7 | | 12 | | 4 | 12 |
| Thickness (nm) of second layer | | 300 | | 200 | | 150 | 200 |
| Thickness (nm) of conductive nanowire layer | | 100 | | 100 | | 100 | 100, 200 |

Experimental Example 4: Measurement of Light Transmittance

Light transmittance was measured for the same films as the transparent EMI shielding film and the transparent EMI shielding/absorbing films 10 and 70 used in Experimental Example 3.

FIGS. 22 to 25 show results of measuring the shielding effectiveness of the transparent EMI shielding film shown in FIG. 1 and the shielding effectiveness of the transparent EMI shielding/absorbing films shown in FIGS. 7 and 12 under the conditions used in Experimental Examples 1 to 4.

Figure 22:
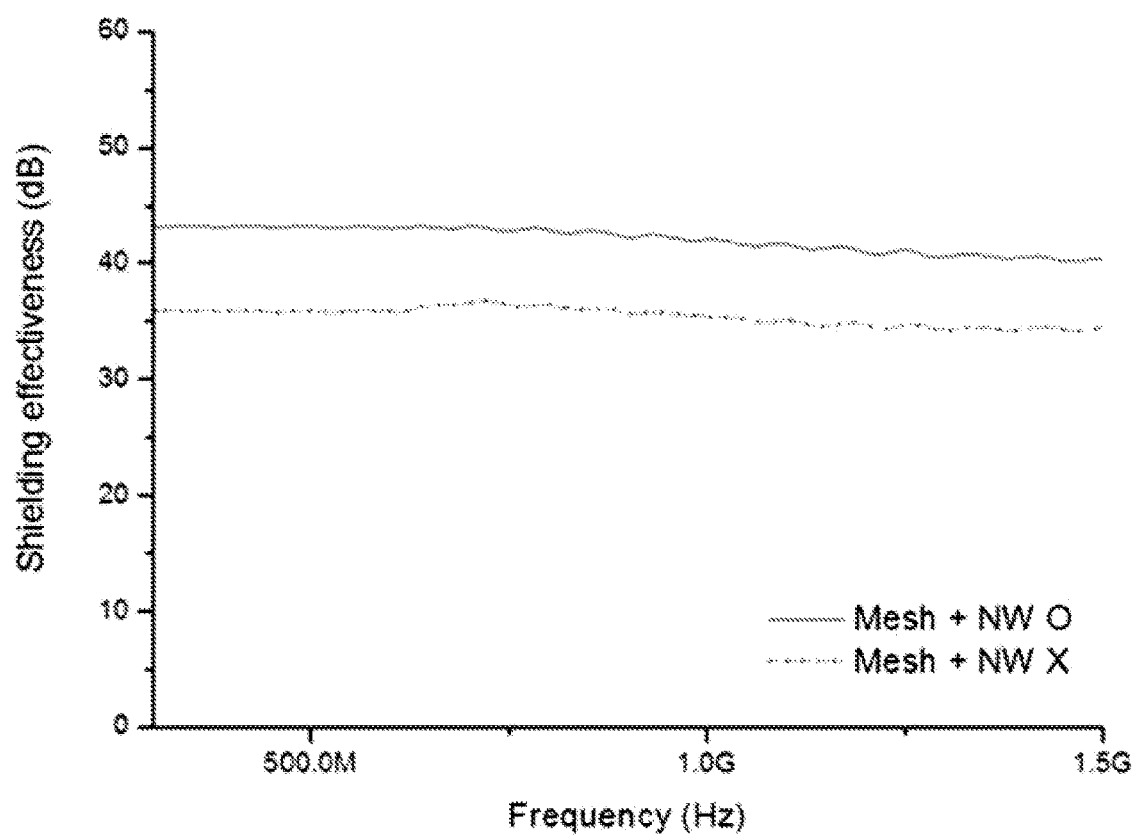
FIGS. 22 to 25 show results of measuring the shielding effectiveness of the transparent EMI shielding film shown in FIG. 1 and the shielding effectiveness of the transparent EMI shielding/absorbing films shown in FIGS. 7 and 12.
Figure 23:
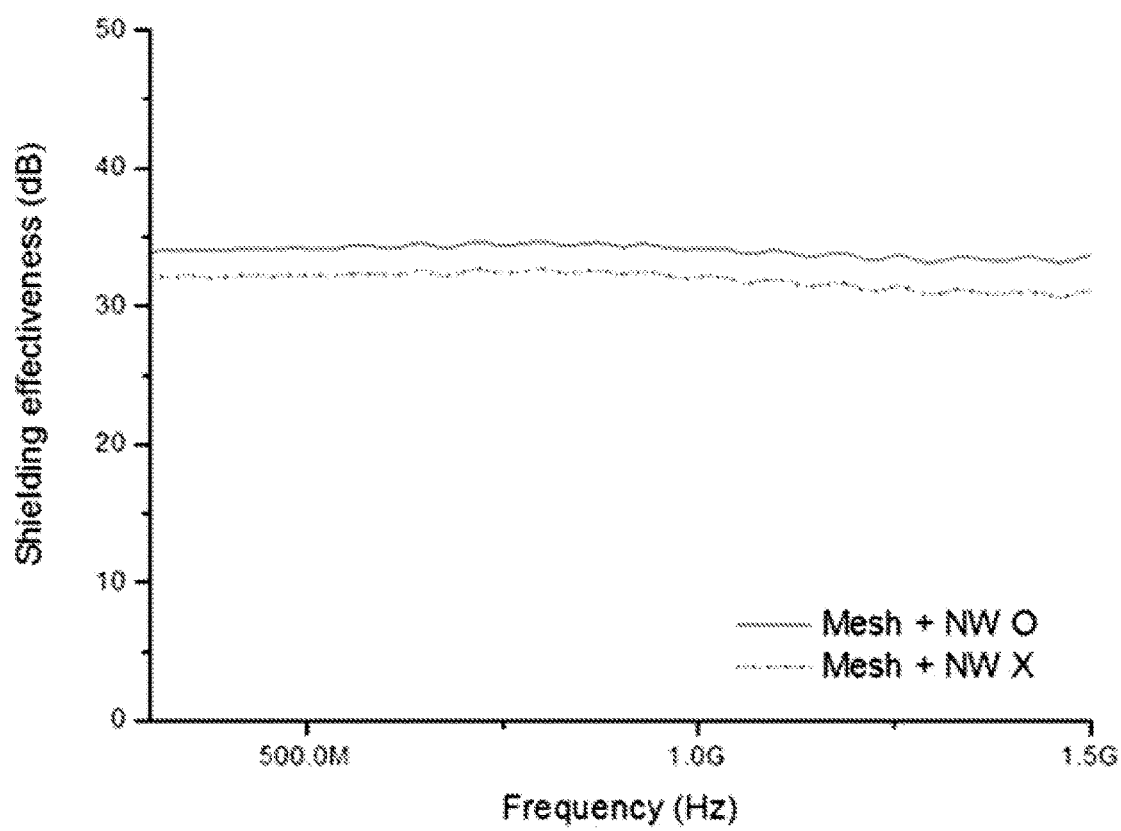
Figure 24:
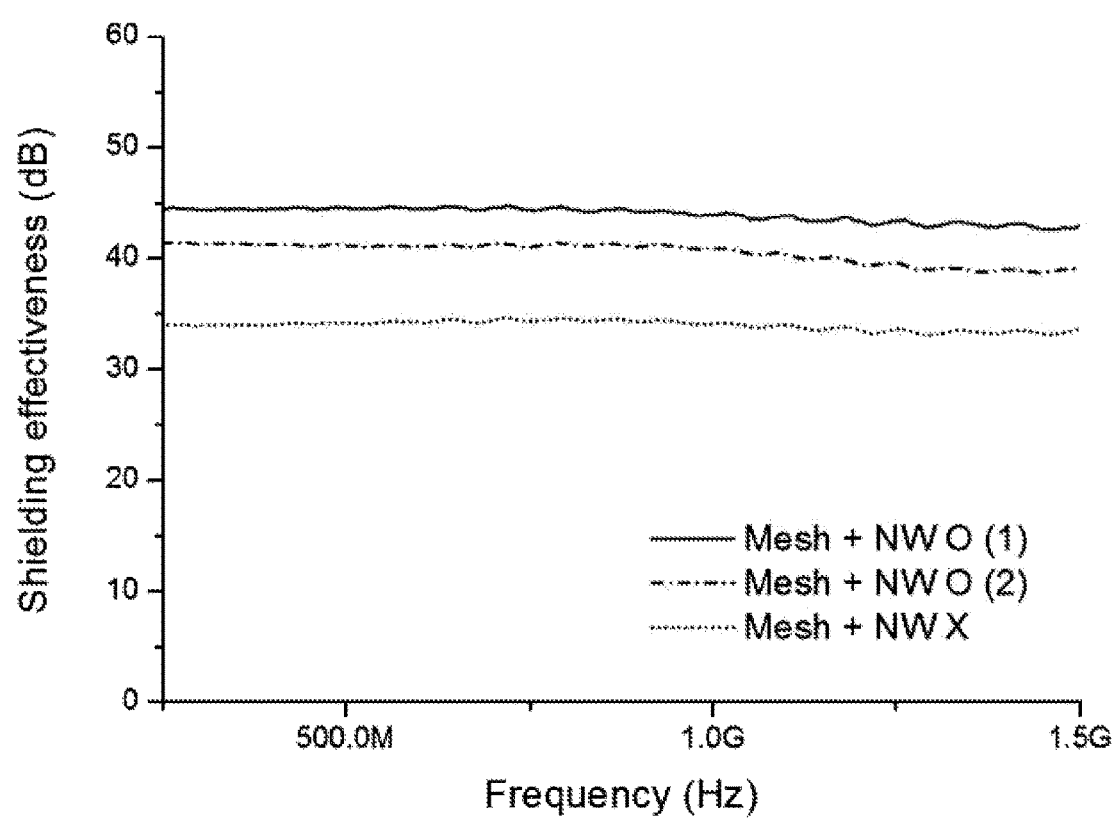

Referring to FIGS. 22 to 24, it can be seen that the transparent EMI shielding/absorbing film as shown in FIG. 7 has superior shielding effectiveness to the transparent EMI shielding film shown in FIG. 1. In particular, it could be seen that the transparent EMI shielding/absorbing film shown in FIG. 7 has superior shielding effectiveness to the transparent EMI shielding film shown in FIG. 1 when the silver nanowires has high electrical conductivity and the second layer 73b has a large thickness.

Figure 25:
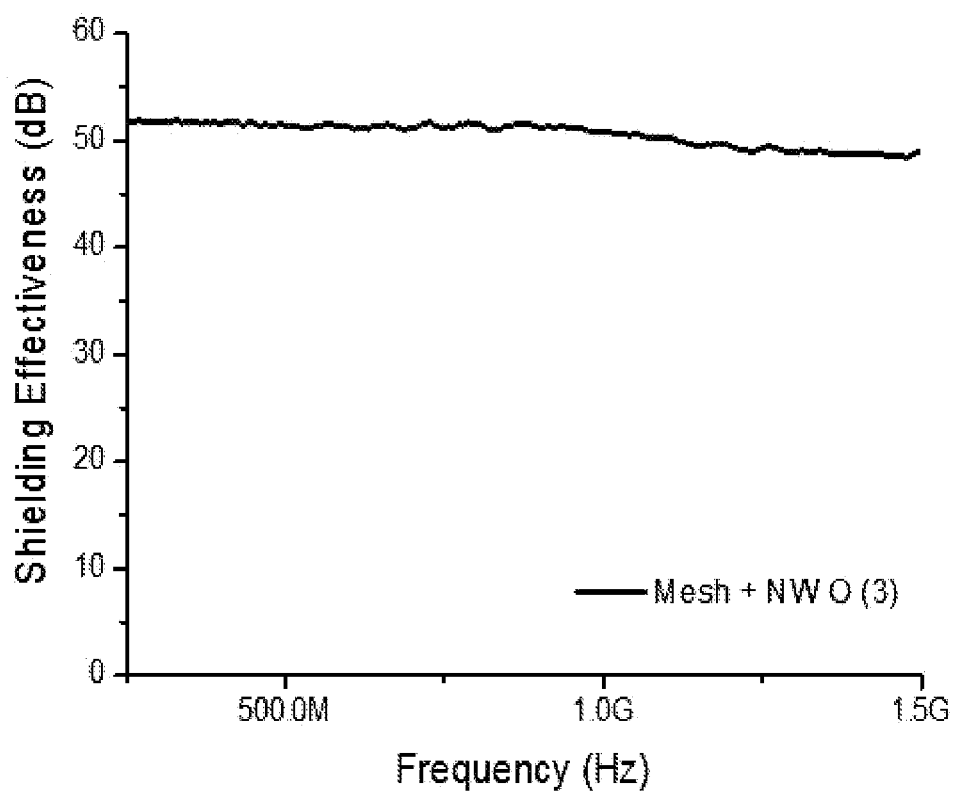

Referring to FIG. 25, it can be seen that the transparent EMI shielding/absorbing film as shown in FIG. 12 has superior shielding effectiveness to the transparent EMI shielding film shown in FIG. 1. In particular, it could be seen that the transparent EMI shielding/absorbing film shown in FIG. 12 has superior shielding effectiveness to the transparent EMI shielding film shown in FIG. 1 when the silver nanowires has high electrical conductivity and the first shielding/absorbing layer 122 formed of a conductive material including conductive nanowires has a high electrical/thermal conductivity.

Figure 26:
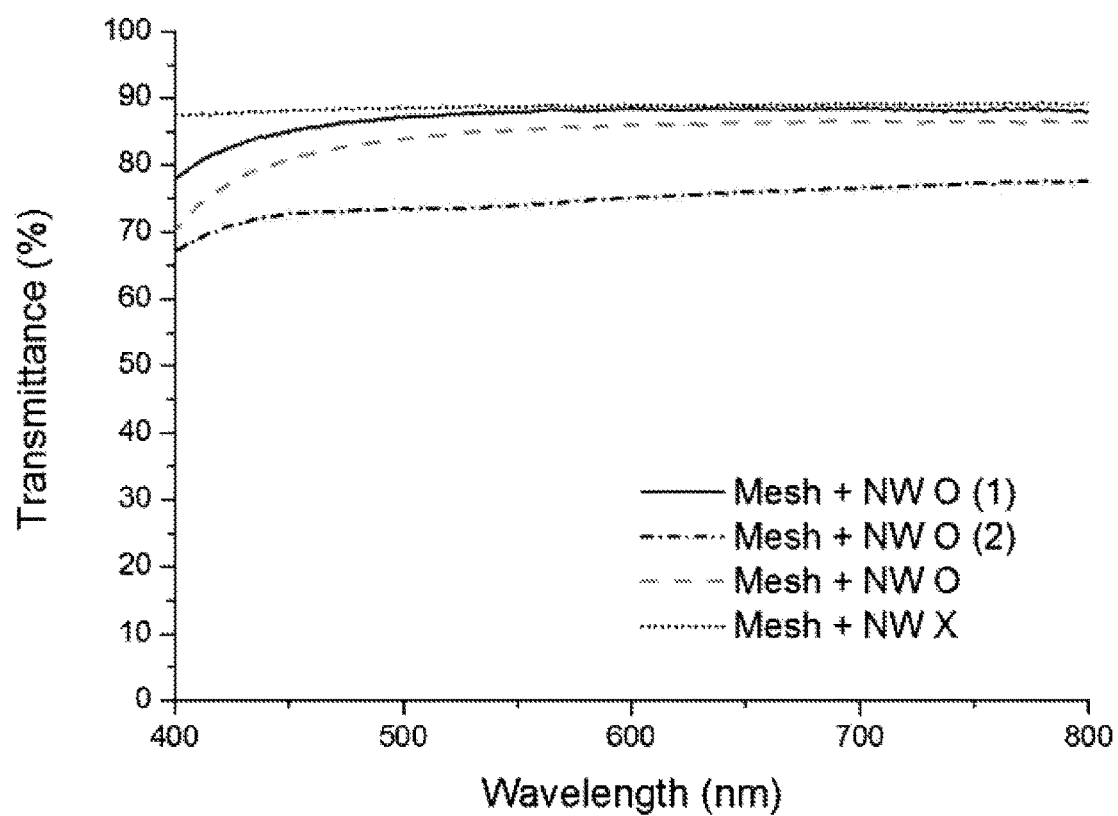
FIGS. 26 and 27 show results of measuring light transmittances of the transparent EMI shielding film shown in FIG. 1 and the transparent EMI shielding/absorbing films shown in FIGS. 7 and 12.
Figure 27:
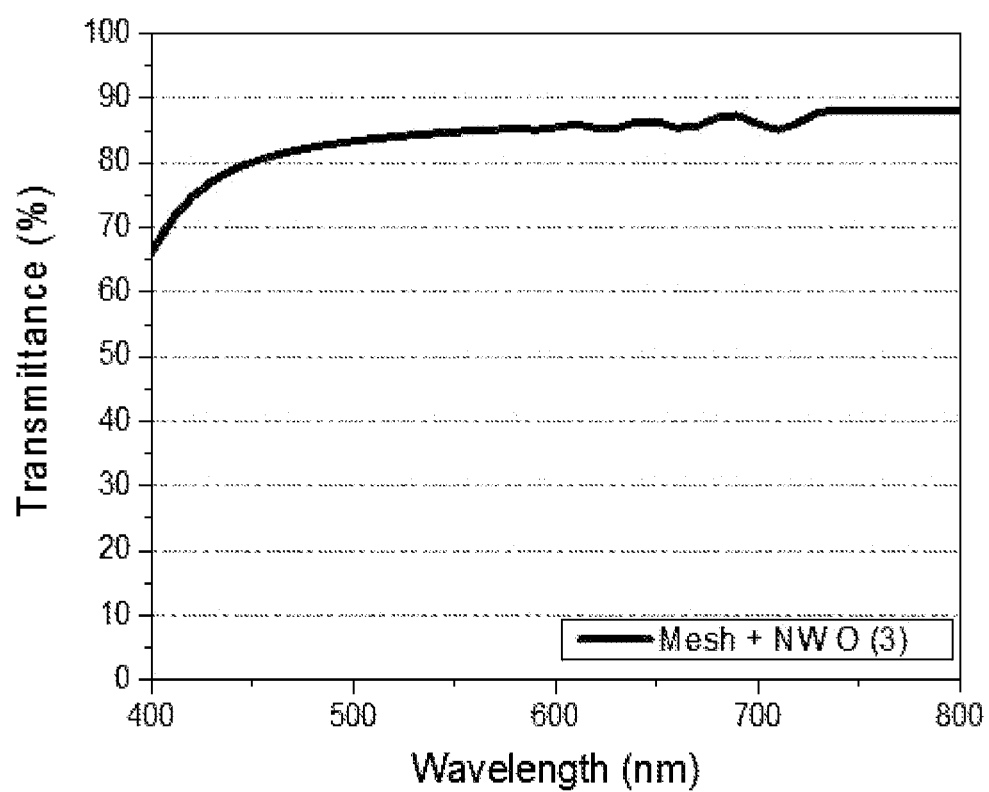

FIGS. 26 and 27 show results of measuring light transmittances of the transparent EMI shielding film shown in FIG. 1 and the transparent EMI shielding/absorbing films shown in FIGS. 7 and 12 under the conditions used in Experimental Example 3, depending on the wavelengths of light.

Referring to FIG. 26, it was revealed that the transparent EMI shielding/absorbing film shown in FIG. 7 had a light transmittance at an ultraviolet wavelength band that is lower than the relative light transmittance of the transparent EMI shielding film shown in FIG. 1 (where it was assumed that the light transmittance of a transparent PET substrate having no conductive layers in the grooves was 100%). It could be seen that the relative light transmittance of the transparent EMI shielding film shown in FIG. 1 at a visible wavelength region of 550 nm was 88.8%, and the relative light transmittance of the transparent EMI shielding/absorbing film including the silver nanowire layer shown in FIG. 7 was 85.6% when the thickness of the nanowire layer was set to 100 nm, indicating that there was no excessive drop in light transmittance. Also, it could be seen that, when the nanowire layer had different thicknesses of 100 and 200 nm, the relative light transmittances of the transparent EMI shielding/absorbing film including the black matrix shown in FIG. 12 were 74% and 88.2%, the values of which were not significantly different, but were higher than the light transmittance of the transparent EMI shielding/absorbing film shown in FIG. 7, indicating that the light transmittance was improved due to the addition of the black matrix.

Referring to FIG. 27, it was revealed that the transparent EMI shielding/absorbing film shown in FIG. 12 had a light transmittance at an ultraviolet wavelength band that is lower than the relative light transmittance of the transparent EMI shielding film shown in FIG. 1. It could be seen that the relative light transmittance of the transparent EMI shielding/absorbing film including the silver nanowire layer 123a shown in FIG. 12 was 85% when the thickness of the nanowire layer was set to 100 nm, indicating that there was no significant drop in light transmittance.

The transparent EMI shielding/absorbing film according to one exemplary embodiment of the present invention has an effect of exhibiting excellent EMI shielding/absorbing performance and simultaneously maintaining high light transmission due to a conductive network that is formed without a disconnection.

It will be apparent to those skilled in the art that various modifications can be made to the above-described exemplary embodiments of the present invention without departing from the scope of the invention. Thus, it is intended that the present invention covers all such modifications provided they come within the scope of the appended claims and their equivalents.

What is claimed is:

1. A transparent EMI shielding/absorbing film comprising:
    a transparent substrate having a top surface on which a pattern having a plurality of engraved grooves is disposed;
    a conductive layer disposed in the grooves; and
    a conductive nanowire layer disposed on the top surface of the transparent substrate and electrically connected with the conductive layer,
    wherein the conductive layer is arranged so that a first layer formed of a conductive material for shielding and absorbing electromagnetic waves and a second layer formed of conductive nanowires are alternately disposed at least once.

2. The transparent EMI shielding/absorbing film of claim 1, further comprising a black matrix in contact with a base surface of the grooves.

3. The transparent EMI shielding/absorbing film of claim 1, wherein the conductive nanowire layer is disposed on a bottom surface facing the top surface of transparent substrate.

4. The transparent EMI shielding/absorbing film of claim 2, wherein the black matrix further comprises a conductive material for shielding and absorbing electromagnetic waves.

5. The transparent EMI shielding/absorbing film of claim 1, wherein the conductive material comprises at least one selected from the group consisting of a metal, a conductive ceramic, a conductive polymer, and a composite thereof.

6. The transparent EMI shielding/absorbing film of claim 5, wherein the metal comprises at least one selected from the group consisting of silver, copper, aluminum, gold, palladium, platinum, nickel, rhodium, ruthenium, tungsten, zinc, a silver-gold alloy, a copper-nickel alloy, a silver-palladium alloy, and a silver-gold-palladium alloy.

7. The transparent EMI shielding/absorbing film of claim 5, wherein the conductive ceramic comprises at least one selected from the group consisting of indium tin oxide (ITO), doped zinc oxide, silicon carbide, carbon, carbon nanofibers, carbon nanotubes (CNTs), and graphene.

8. The transparent EMI shielding/absorbing film of claim 5, wherein the conductive polymer comprises at least one selected from the group consisting of a polyacetylene, a polypyrrole, a polythiophene, a polyisothianaphthene, a polyphenylenevinylene, a polyaniline, a polyalkylthiophene, and a polyfuran.

9. The transparent EMI shielding/absorbing film of claim 1, wherein the conductive layer further comprises at least one selected from the group consisting of a magnetic metal, a magnetic ceramic, a dielectric, a conductive plastic, and a core/shell-shaped composite.

10. The transparent EMI shielding/absorbing film of claim 1, wherein the conductive layer further comprises at least one selected from the group consisting of a magnetic metal having shape anisotropy, a magnetic ceramic, and a polymer composite including dielectric particles in the groove layer.

11. The transparent EMI shielding/absorbing film of claim 10, wherein the conductive layer further comprises at least one selected from the group consisting of conductive nanowires, nanotubes, and a polymer composite including the nanowires in the groove layer.

* * * * *